(12) United States Patent
Lee

(10) Patent No.: US 12,446,445 B2
(45) Date of Patent: Oct. 14, 2025

(54) DISPLAY APPARATUS

(71) Applicant: Samsung Display Co., Ltd., Yongin-si (KR)

(72) Inventor: Hyeonbum Lee, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 473 days.

(21) Appl. No.: 17/540,728

(22) Filed: Dec. 2, 2021

(65) Prior Publication Data

US 2022/0407038 A1   Dec. 22, 2022

(30) Foreign Application Priority Data

Jun. 16, 2021   (KR) .................. 10-2021-0078067

(51) Int. Cl.
| | |
|---|---|
| *H10K 59/80* | (2023.01) |
| *H10K 50/80* | (2023.01) |
| *H10K 50/84* | (2023.01) |
| *H10K 50/858* | (2023.01) |
| *H10K 50/86* | (2023.01) |
| *H10K 59/122* | (2023.01) |
| *H10K 59/38* | (2023.01) |

(52) U.S. Cl.
CPC ........... *H10K 59/879* (2023.02); *H10K 50/84* (2023.02); *H10K 50/858* (2023.02);
(Continued)

(58) Field of Classification Search
CPC ........... H10K 50/00–87; H10K 59/122; H10K 59/38; H10K 59/871; H10K 59/8793; H10K 59/879; H10K 59/352; H10K 59/121; H10K 59/124; H10K 59/126; H10K 59/131; H10K 59/123; H10K 59/80–8794; H10K 59/00–88; H10K 59/12–1315; H10K 59/173; H10K 59/18; H10K 2102/311; H10K 2102/341; H10K 2102/30; H10K 2102/361; H10K 70/00; H10K 71/00–441; H10K 71/831–861; H10K 30/865; H10K 2101/00–80; H10K 85/00–761; H10K 77/10; H10K 77/111; H05B 33/02;
(Continued)

(56) References Cited

U.S. PATENT DOCUMENTS

| | | |
|---|---|---|
| 7,675,598 B2 | 3/2010 | Hong |
| 2013/0187131 A1 | 7/2013 | Chung et al. |

(Continued)

FOREIGN PATENT DOCUMENTS

| | | |
|---|---|---|
| KR | 10-1275810 | 6/2013 |
| KR | 10-1355919 | 1/2014 |

(Continued)

*Primary Examiner* — David Vu
(74) *Attorney, Agent, or Firm* — Harness, Dickey & Pierce, P.L.C.

(57) ABSTRACT

A display apparatus includes a display element disposed on a substrate; an encapsulation layer disposed on the display element; a light-blocking layer disposed on the encapsulation layer and including a first opening at a location corresponding to an emission area of the display element; a first refractive layer disposed on the light-blocking layer and including a second opening overlapping the first opening of the light-blocking layer; and a second refractive layer disposed on the first refractive layer, the second refractive layer having a refractive index that is higher than a refractive index of the first refractive layer.

15 Claims, 24 Drawing Sheets

(52) U.S. Cl.
CPC ......... *H10K 50/865* (2023.02); *H10K 50/868* (2023.02); *H10K 59/122* (2023.02); *H10K 59/38* (2023.02); *H10K 59/871* (2023.02); *H10K 59/8793* (2023.02)

(58) Field of Classification Search
CPC ........ H05B 33/04; H05B 33/06; H05B 33/10; H05B 33/22; B32B 2457/206; H01L 33/00–648; H01L 27/15–156; H01L 2933/00–0091
See application file for complete search history.

(56) References Cited

U.S. PATENT DOCUMENTS

| | | |
|---|---|---|
| 2017/0062528 A1* | 3/2017 | Aoyama ............... H10K 59/122 |
| 2017/0155093 A1* | 6/2017 | Jo .......................... H10K 50/84 |
| 2019/0165074 A1 | 5/2019 | Lee et al. |
| 2019/0221767 A1 | 7/2019 | Lee et al. |
| 2020/0210005 A1* | 7/2020 | Kim ....................... G06F 3/0412 |
| 2021/0005845 A1 | 1/2021 | Kim et al. |
| 2021/0050557 A1 | 2/2021 | Yun et al. |
| 2022/0085335 A1* | 3/2022 | Shimatsu ............... H10K 59/38 |

FOREIGN PATENT DOCUMENTS

| | | |
|---|---|---|
| KR | 10-2018-0135342 | 12/2018 |
| KR | 10-2019-0064701 | 6/2019 |
| KR | 10-2019-0088148 | 7/2019 |
| KR | 10-2020-0085968 | 7/2020 |
| KR | 10-2021-0004006 | 1/2021 |
| KR | 10-2021-0020187 | 2/2021 |
| KR | 102334953 B1 * | 12/2021 |

* cited by examiner

DISPLAY APPARATUS

CROSS-REFERENCE TO RELATED APPLICATION(S)

This application claims priority to and benefits of Korean Patent Application No. 10-2021-0078067 under 35 U.S.C. § 119, filed on Jun. 16, 2021, in the Korean Intellectual Property Office, the entire contents of which are incorporated herein by reference.

BACKGROUND

1. Field

The embodiments relate to a display apparatus.

2. Description of the Related Art

Demand for display apparatuses has grown and the need for display apparatuses which can be used for a wider range of applications has increased. In accordance with this trend, display apparatuses have increased in size and decreased in thickness. As the applications of display apparatuses have become broader, demand for display apparatuses capable of providing high-quality images has increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments provide a display apparatus for decreasing a side visibility and reducing a risk of exposure of personal information in public facilities and multiple-use establishments. However, these objectives are examples and do not limit the scope of the disclosure.

Additional aspects will be set forth in part in the description which follows and, in part, will be apparent from the description, or may be learned by practice of the embodiments of the disclosure.

According to one or more embodiments, a display apparatus may include aa display element disposed on a substrate, an encapsulation layer disposed on the display element, a light-blocking layer disposed on the encapsulation layer, the light-blocking layer including a first opening at a location corresponding to an emission area of the display element, a first refractive layer disposed on the light-blocking layer, the first refractive layer including a second opening overlapping the first opening of the light-blocking layer, and a second refractive layer disposed on the first refractive layer, the second refractive layer having a refractive index that is higher than a refractive index of the first refractive layer.

An edge of the first opening of the light-blocking layer may correspond to an edge of the second opening of the first refractive layer.

An edge of the first opening of the light-blocking layer and an edge of the second opening of the first refractive layer may be spaced apart from each other.

The display apparatus may further include a pixel-defining layer including a third opening corresponding to the emission area of the display element and covering an edge of a pixel electrode of the display element. An edge of the first opening of the light-blocking layer may correspond to an edge of the third opening of the pixel-defining layer.

The display apparatus may further include a pixel-defining layer including a third opening corresponding to the emission area of the display element and covering an edge of a pixel electrode of the display element. A portion of an edge of the first opening of the light-blocking layer may be spaced apart from a portion of an edge of the third opening of the pixel-defining layer. A remaining portion of the edge of the first opening of the light-blocking layer may correspond to the remaining portion of the edge of the third opening of the pixel-defining layer.

The light-blocking layer may include a plurality of layers. An insulating layer may be disposed between the plurality of layers.

The display apparatus may further include a polarizing layer disposed on the second refractive layer.

According to one or more embodiments, a display apparatus may include a substrate including a display area including a first area and a second area, a first display element disposed on the first area of the substrate, a second display element disposed on the second area of the substrate, an encapsulation layer disposed on the first display element and the second display element, a light-blocking layer disposed on the encapsulation layer and including a first opening at a location corresponding to an emission area of the second display element, a first refractive layer disposed on the light-blocking layer and including a second opening overlapping the first opening of the light-blocking layer, and a second refractive layer disposed on the first refractive layer, the second refractive layer having a refractive index that is higher than a refractive index of the first refractive layer.

The first display element and the second display element may emit light of a same color. A size of a pixel electrode of the second display element may be greater than a size of a pixel electrode of the first display element.

The display apparatus may further include a pixel-defining layer including a third opening and a plurality of fourth openings. The third opening may correspond to an emission area of the first display element. The plurality of fourth openings may correspond to a plurality of sub-emission areas that divide the emission area of the second display element. The first opening of the light-blocking layer may overlap at least one of the plurality of fourth openings of the pixel-defining layer.

An edge of the first opening of the light-blocking layer may correspond to an edge of at least one of the plurality of fourth openings of the pixel-defining layer.

A portion of an edge of the first opening of the light-blocking layer may be spaced apart from a portion of an edge of at least one of the plurality of fourth openings of the pixel-defining layer, and a remaining portion of the edge of the first opening of the light-blocking layer may correspond to a remaining portion of the edge of at least one of the plurality of fourth openings of the pixel-defining layer.

The light-blocking layer may include a plurality of layers. An insulating layer may be disposed between the plurality of layers.

The display apparatus may further include a controller that controls the first display element and the second display element to emit light in a first driving mode and controls the first display element not to emit light and the second display element to emit light in a second driving mode.

According to one or more embodiments, a display apparatus may include a display element disposed on a substrate, an encapsulation layer disposed on the display element, and a plurality of light-blocking layers disposed on the encapsulation layer and each of the plurality of light-blocking layers including a first opening at a location corresponding to an emission area of the display element.

The display apparatus may further include a pixel-defining layer having a second opening corresponding to the emission area of the display element, and an edge of the first opening of each of the plurality of light-blocking layers corresponds to an edge of the second opening of the pixel-defining layer.

The display apparatus may further include a pixel-defining layer including a second opening corresponding to the emission area of the display element. A portion of an edge of the first opening of each of the light-blocking layers may be spaced apart from a portion of an edge of the second opening of the pixel-defining layer. A remaining portion of the edge of the first opening of each of the light-blocking layers may correspond to a remaining portion of the edge of the second opening of the pixel-defining layer.

The display apparatus may further include a first refractive layer disposed on an uppermost one of the plurality of light-blocking layers and a second refractive layer. The first refractive layer may include a third opening overlapping the first opening of each of the plurality of light-blocking layers. The second refractive layer may be disposed on the first refractive layer and may have a refractive index that is higher than a refractive index of the first refractive layer.

The display apparatus may further include a polarizing layer disposed on the second refractive layer.

The display apparatus may further include a color filter layer disposed on an uppermost one of the plurality of light-blocking layers. The color filter layer may overlap the emission area of the display element.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
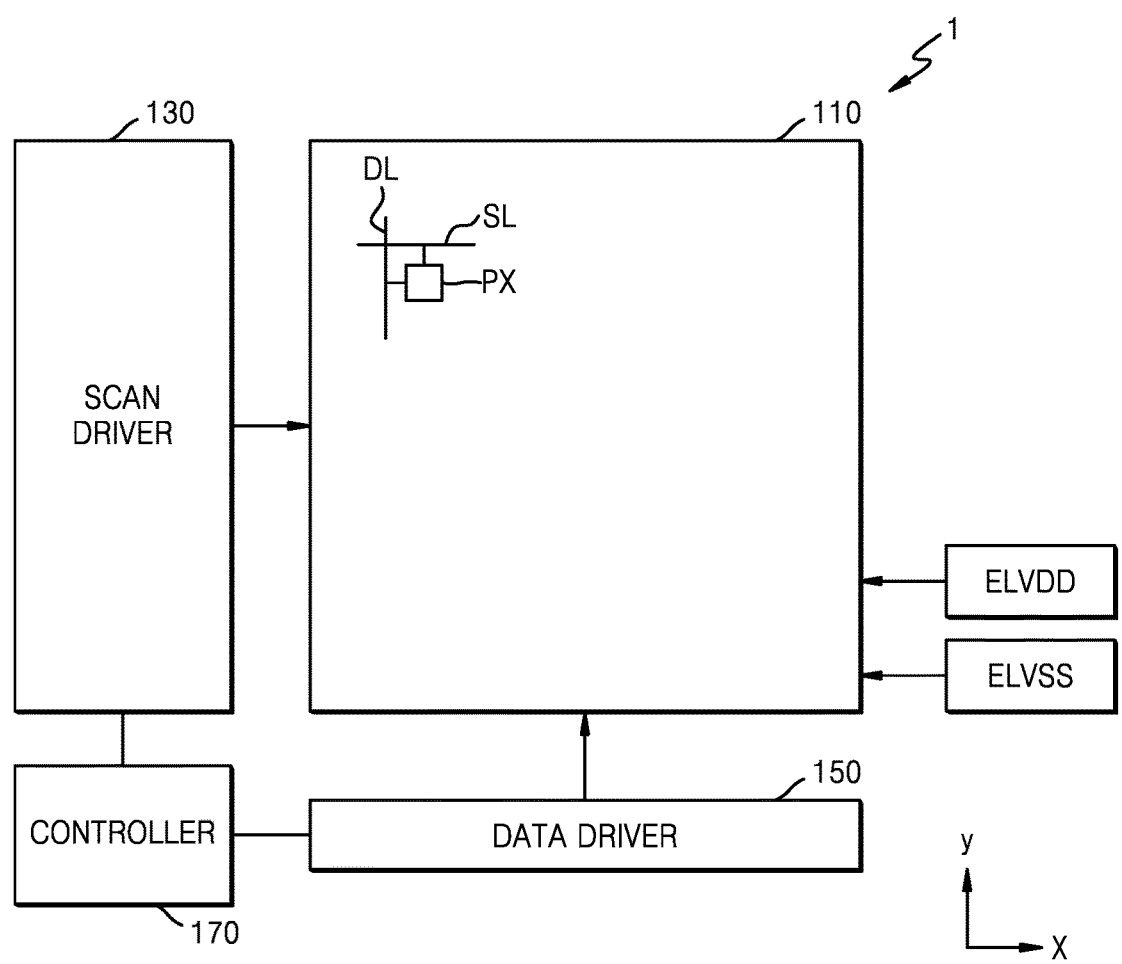
FIG. 1 is a schematic diagram of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Reference will now be made in detail to embodiments, examples of which are illustrated in the accompanying drawings. Like reference numerals refer to like elements throughout. The embodiments may have different forms and should not be construed as being limited to the descriptions set forth herein. Accordingly, the embodiments are described below, by referring to the figures, to explain aspects of the description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various elements, these elements should not be limited by these terms. These elements are only used to distinguish one element from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being formed "on" another layer, area, or element, it can be directly or indirectly formed on the other layer, region, or element. For example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it can be directly or indirectly in contact with or electrically connected to the other element, area, or layer.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In this specification, the expression "A and/or B" may indicate A, B, or A and B.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

FIG. 1 is a schematic diagram of a display apparatus 1 according to an embodiment.

Referring to FIG. 1, the display apparatus 1 may include a display 110, a scan driver 130, a data driver 150, and a controller 170.

In the display 110, pixels PX and signal lines applying electrical signals to the pixels PX may be disposed.

The pixels PX may be repeatedly arranged in a first direction (an x direction, i.e., a row direction) and a second direction (a y direction, i.e., a column direction). The pixels PX may be arranged in various arrangement forms, for example, a stripe form, a PENTILE™ form, a mosaic form, etc., to realize an image.

The signal lines that apply electrical signals to the pixels PX may include scan lines SL extending in the first direction, data lines DL extending in the second direction, etc. The scan lines SL may be arranged in the second direction to be spaced apart from each other and may transmit scan signals to the pixels PX. The data lines DL may be arranged in the first direction to be spaced apart from each other and may transmit data signals to the pixels PX. Each of the pixels PX may be connected to at least one corresponding scan line SL from among the scan lines SL, and a corresponding data line DL from among the data lines DL.

When the display apparatus 1 is an organic electroluminescence display apparatus, a first power voltage ELVDD and a second power voltage ELVSS may be supplied to the pixels PX of the display 110. The first power voltage ELVDD may be a high-level voltage provided to a first electrode (a pixel electrode or an anode) of a display element included in each pixel PX. The second power voltage ELVSS may be a low-level voltage provided to a second electrode (an opposite electrode or a cathode) of the display element included in each pixel PX. The first power voltage ELVDD and the second power voltage ELVSS may be driving voltages for having the pixels PX emit light.

The scan driver 130 may be connected to the scan lines SL and may generate scan signals in response to a scan control signal from the controller 170 and sequentially supply the scan signals to the scan lines SL.

The data driver 150 may be connected to the data lines DL and may supply data signals to the data lines DL in response to a data control signal from the controller 170.

The controller 170 may generate the scan control signal and the data control signal based on signals input from the outside. The controller 170 may supply the scan control signal to the scan driver 130 and supply the data control signal to the data driver 150.

Hereinafter, an organic light-emitting display apparatus is described as an example of a display apparatus according to an embodiment. However, the display apparatus is not limited thereto. In other embodiments, the display apparatus may include display apparatuses, such as an inorganic light-emitting display apparatus, an inorganic electro-luminescence display apparatus, and a quantum dot light-emitting display apparatus.

Figure 2:
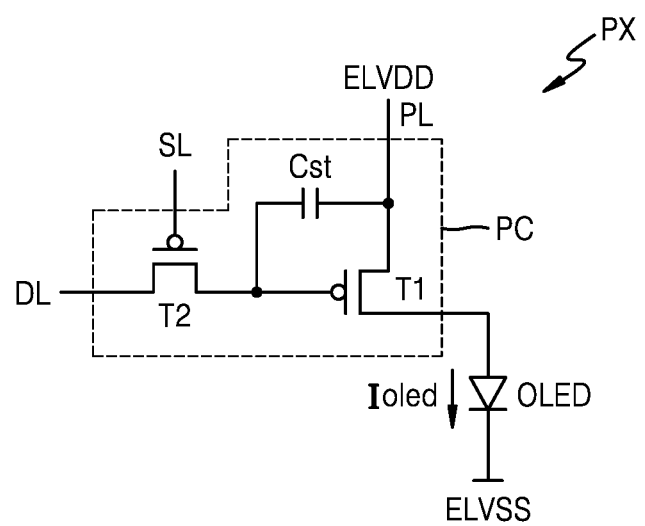
FIG. 2 is an equivalent circuit diagram of a pixel according to an embodiment.

FIG. 2 is an equivalent circuit diagram of a pixel PX according to an embodiment.

Referring to FIG. 2, the pixel PX may include a display element, such as an organic light-emitting diode OLED. The display element may be connected to a pixel circuit PC that drives the display element, and the pixel circuit PC may include a thin-film transistor, a capacitor, and the like.

According to an embodiment, the pixel circuit PC may include a first transistor T1, a second transistor T2, and a capacitor Cst. Each pixel PX may emit, for example, red, green, blue, or white light through the organic light-emitting diode OLED. The first transistor T1 and the second transistor T2 may be realized as thin-film transistors.

The second transistor T2, which is a switching transistor, may be connected to the scan lines SL and the data lines DL and may transmit a data signal input from the data lines DL to the first transistor T1 in response to a scan signal input from the scan lines SL. The capacitor Cst may be connected to the second transistor T2 and a driving voltage line PL and may store a voltage corresponding to a difference between a voltage corresponding to the data signal that is received from the second transistor T2 and a driving voltage ELVDD supplied to the driving voltage line PL.

The first transistor T1, which is a driving transistor, may be connected to the driving voltage line PL and the capacitor Cst and may control a driving current flowing from the driving voltage line PL through the organic light-emitting diode OLED in correspondence with a value of the voltage stored in the capacitor Cst. The organic light-emitting diode OLED may emit light having a selected brightness according to a driving current Ioled. An opposite electrode of the organic light-emitting diode OLED may receive the second power voltage (a common voltage) ELVSS.

In FIG. 2, it is described that the pixel circuit PC may include two transistors and one capacitor. However, the disclosure is not limited thereto. The number of transistors and the number of capacitors may vary according to a design of the pixel circuit PC.

Figure 3A:
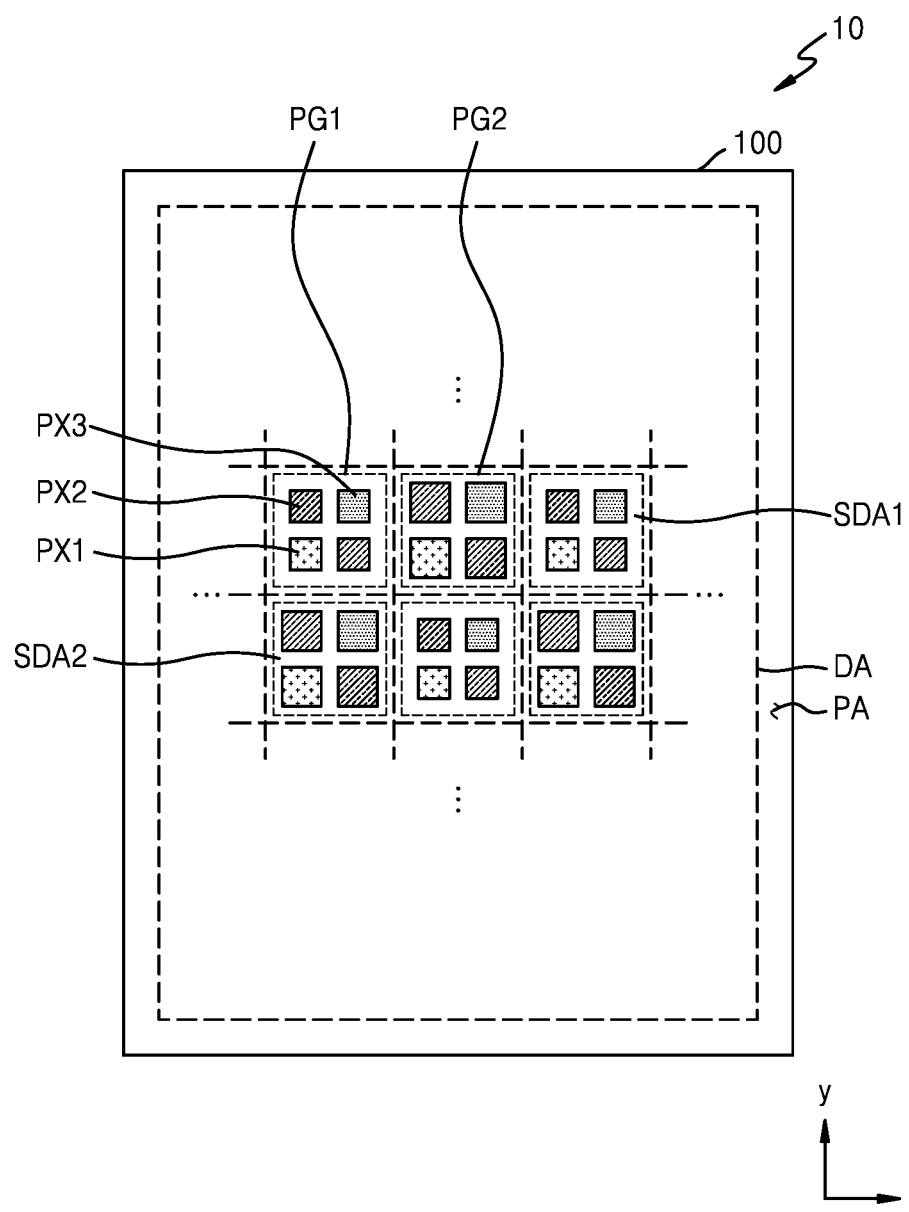
FIG. 3A is a schematic plan view of a display apparatus according to an embodiment.
Figure 3B:
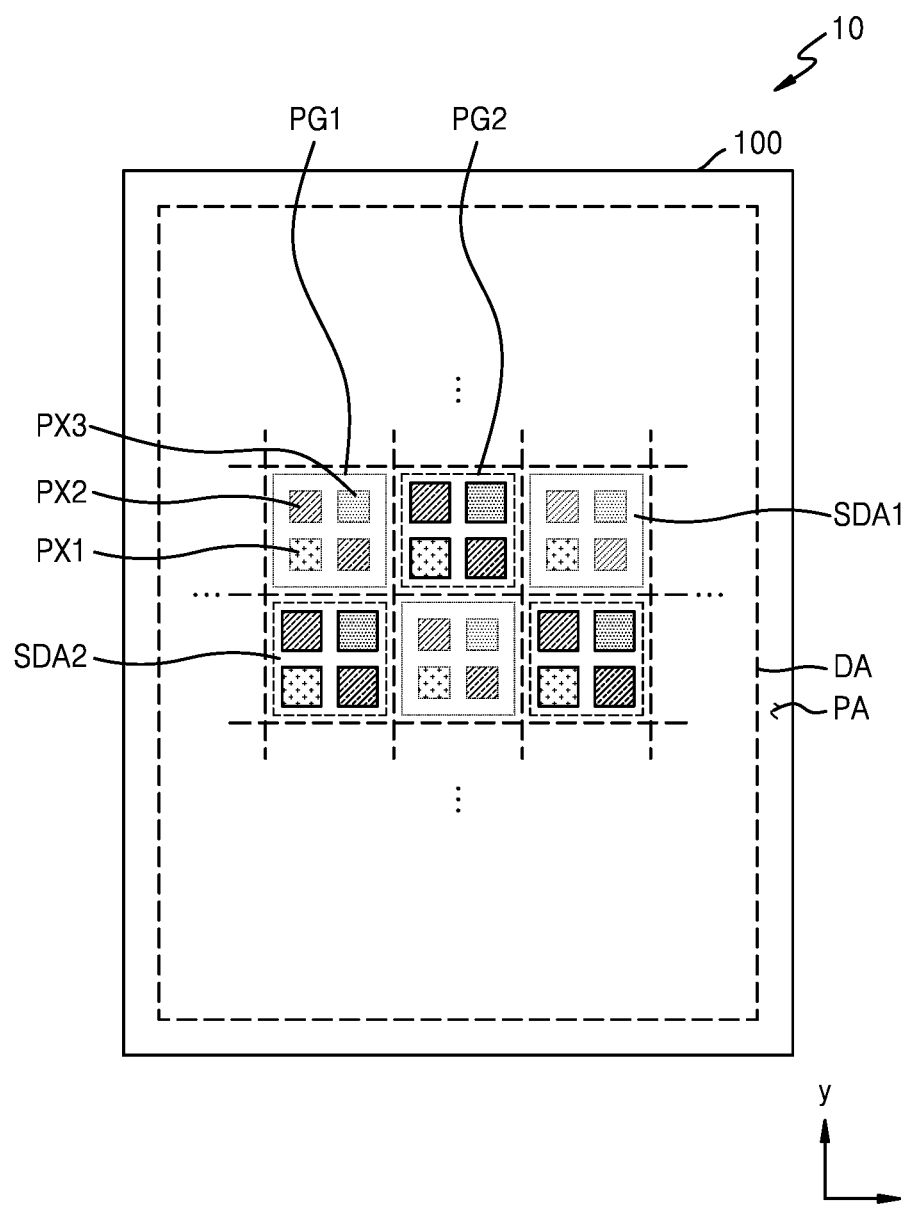
FIG. 3B illustrates a driving operation of the display apparatus of FIG. 3A.

FIG. 3A is a schematic plan view of a display apparatus according to an embodiment. FIG. 3B is a view describing a driving operation of the display apparatus of FIG. 3A.

Referring to FIG. 3A, the display apparatus may include a display panel 10. The display panel 10 may include a display area DA and a peripheral area PA outside the display area DA. The peripheral area PA may be a type of non-display area in which pixels PX are not arranged. The display area DA may be completely surrounded by the peripheral area PA. Various components included in the display panel 10 may be disposed on the substrate 100. Thus, it may be understood that the substrate 100 may include the display area DA and the peripheral area PA.

Pixels PX may be disposed in the display area DA. In this specification, a pixel P may be defined as an emission area in the display area DA, from which light of any of red, green, blue, and white colors is emitted.

The pixels PX may include first pixels PX1 displaying a first color, second pixels PX2 displaying a second color, and third pixels PX3 displaying a third color. According to an embodiment, the first pixel PX1 may be a red pixel, the second pixel PX2 may be a green pixel, and the third pixel PX3 may be a blue pixel.

In this specification, the sizes of the first through third pixels PX1 through PX3 may be the sizes of emission areas EA of display elements of each of the first through third pixels PX1 through PX3, respectively. The emission area EA may be defined by an emission layer above a pixel electrode or an opening of a pixel-defining layer. Accordingly, a width of the emission area EA may be substantially equal to a width of the opening of the pixel-defining layer.

In the display area DA, pixel groups PG may include a selected number of pixels PX and may be repeatedly arranged in a first direction and a second direction. Each pixel group PG may include two second pixels PX2, one first pixel PX1, and one third pixel PX3. The pixel groups PG may include a first pixel group PG1 and a second pixel group PG2. In the display area DA, the first pixel group PG1 and the second pixel group PG2 may be alternately arranged in the first direction and the second direction. Accordingly, in the display area DA, first sub-display areas SDA1 in which a first pixel group PG1 is disposed and second sub-display areas SDA2 in which a second pixel group PG2 is disposed may be repeatedly arranged in the first direction and the second direction. The first pixel group PG1 and the second pixel group PG2 may each have square shapes and include two second pixels PX2, one first pixel PX1, and one third pixel PX3. The first pixel group PG1 and the second pixel group PG2 each may be defined based on the repeated shape and arrangement and may not mean a disconnection between the components.

A size (an area) of the first sub-display area SDA1 and a size (an area) of the second sub-display area SDA2 may be the same as or different from each other. FIG. 3A illustrates an example in which the size (the area) of the first sub-display area SDA1 and the size (the area) of the second sub-display area SDA2 may be the same as each other.

According to an embodiment, an arrangement of the first pixel PX1, the second pixel PX2, and the third pixel PX3 included in the first pixel group PG1 may be the same as an arrangement of the first pixel PX1, the second pixel PX2, and the third pixel PX3 included in the second pixel group PG2. Sizes (areas) of the first through third pixels PX1 through PX3 in the second pixel group PG2 may be greater than sizes (areas) of the corresponding first through third pixels PX1 through PX3 in the first pixel group PG1, respectively. Sizes (areas) of pixel electrodes or emission areas of the first through third pixels PX1 through PX3 in the second pixel group PG2 may be greater than sizes (areas) of pixel electrodes or emission areas of the corresponding first through third pixels PX1 through PX3 in the first pixel group PG1, respectively. For example, the size (the area) of the pixel electrode or the emission area of the first pixel PX1 in the second pixel group PG2 may be greater than the size (the area) of the pixel electrode or the emission area of the first pixel PX1 in the first pixel group PG1.

The pixels PX are not disposed in the peripheral area PA and the peripheral area PA may not provide an image. A driving circuit portion that drives the pixels PX, for example, the scan driver 130, the data driver 150, the controller 170, power supply lines, etc. illustrated in FIG. 1, may be disposed in the peripheral area PA.

A display apparatus according to an embodiment may operate in a normal driving mode (a first mode) or a private driving mode (a second mode). In the normal driving mode, light from the display apparatus is provided in viewing angles that are visible from all directions. In the private driving mode, light from the display apparatus is visible only from a narrow viewing angle. Compared to the normal driving mode, visibility from the side may be decreased or blocked in the private driving mode. While the display apparatus operates in the private driving mode, the viewing angles of the display apparatus from the sides may be decreased or blocked. Thus, exposure of personal information may be prevented.

When the controller 170 (FIG. 1) receives a selection signal with respect to the normal driving mode or the private driving mode, the controller 170 may output, to the scan driver 130 (FIG. 1) and the data driver 150 (FIG. 1), a control signal for the display apparatus to operate in the normal driving mode or the private driving mode according to the selection signal.

In the normal driving mode, all of the first through third pixels PX1 through PX3 included in the first pixel group PG1 and the second pixel group PG2 of the display area DA may be selected by a scan signal and the pixels in both the first pixel group PG1 and the second pixel group PG2 may emit light of a brightness corresponding to a data signal.

As illustrated in FIG. 3B, in the private driving mode, the first through third pixels PX1 through PX3 included in the first pixel group PG1 of the display area DA may not emit light, and only the first through third pixels PX1 through PX3 included in the second pixel group PG2 may emit light of a brightness corresponding to a data signal. The pixel that does not emit light may not be selected by the scan signal, and thus, the pixel may not receive a data signal, or the pixel may be selected by a scan signal, but may receive a black data signal and thus display a black color.

Figure 4:
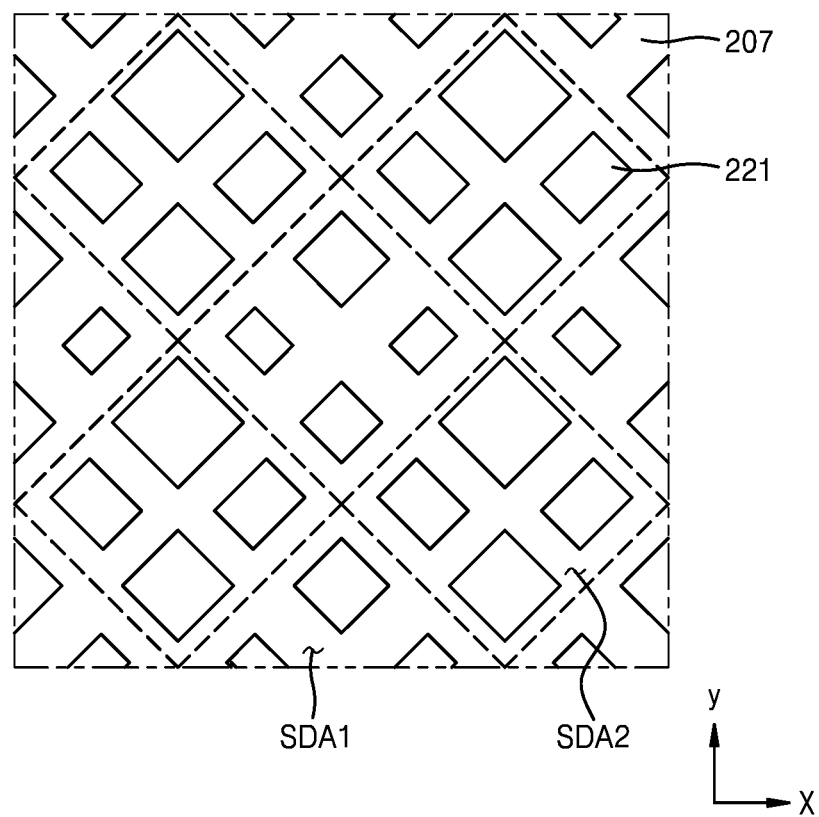
FIGS. 4 and 5 are schematic plan views of a portion of a display area in a display layer of a display apparatus according to an embodiment.
Figure 5:
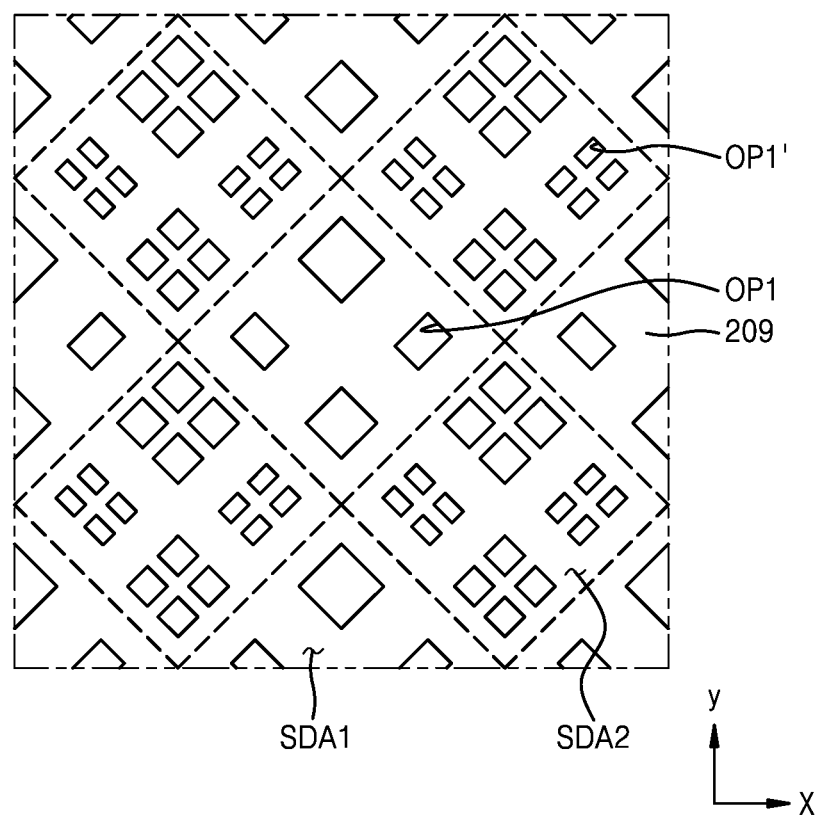
Figure 6:
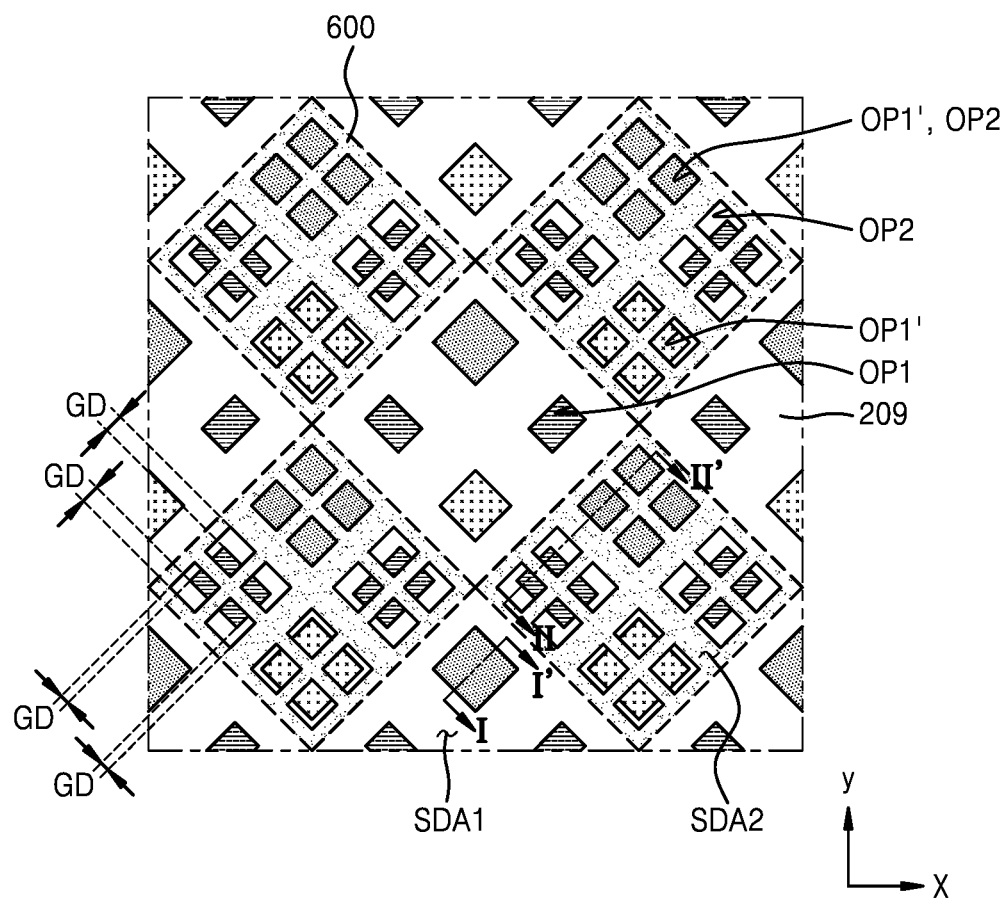
FIG. 6 is a schematic plan view of a portion of a display area in a display layer and a light-blocking layer of a display apparatus according to an embodiment.
Figure 7:
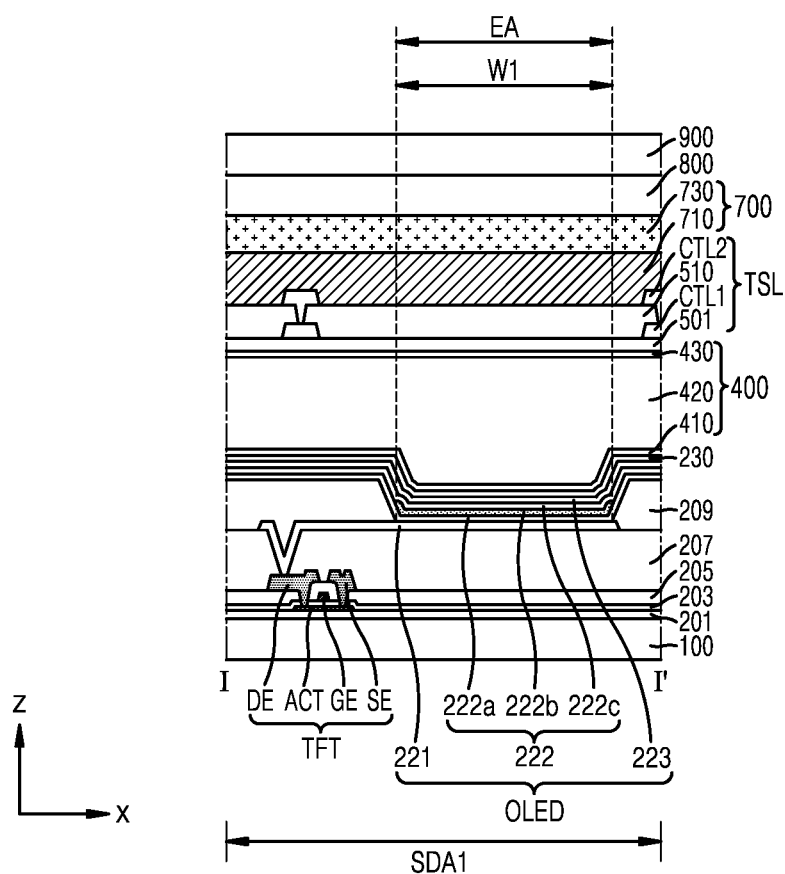
FIG. 7 is a schematic cross-sectional view of the display area taken along line I-I' of FIG. 6.
Figure 8:
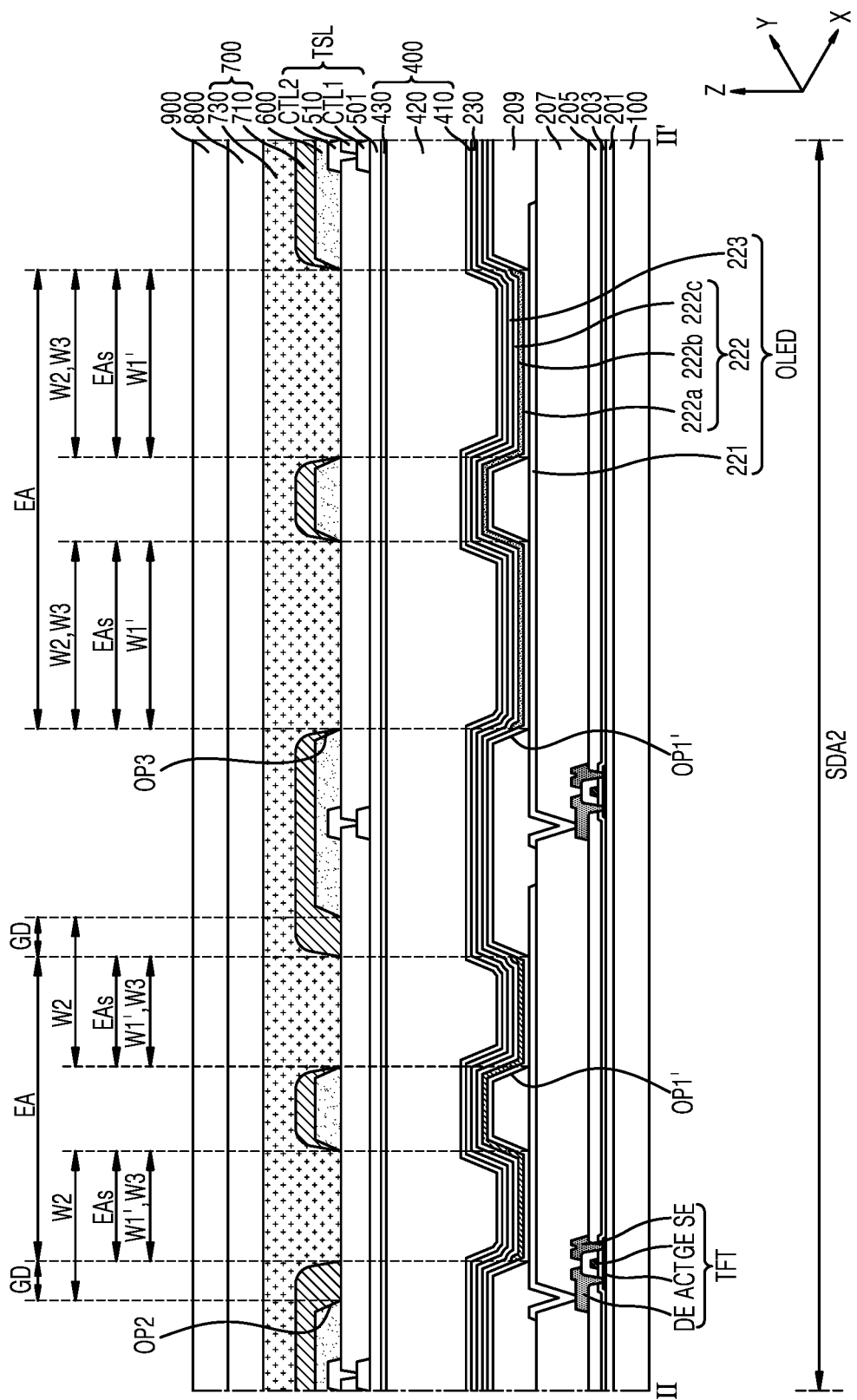
FIGS. 8 and 9 are schematic cross-sectional views of the display area taken along line II-II' of FIG. 7.
Figure 9:
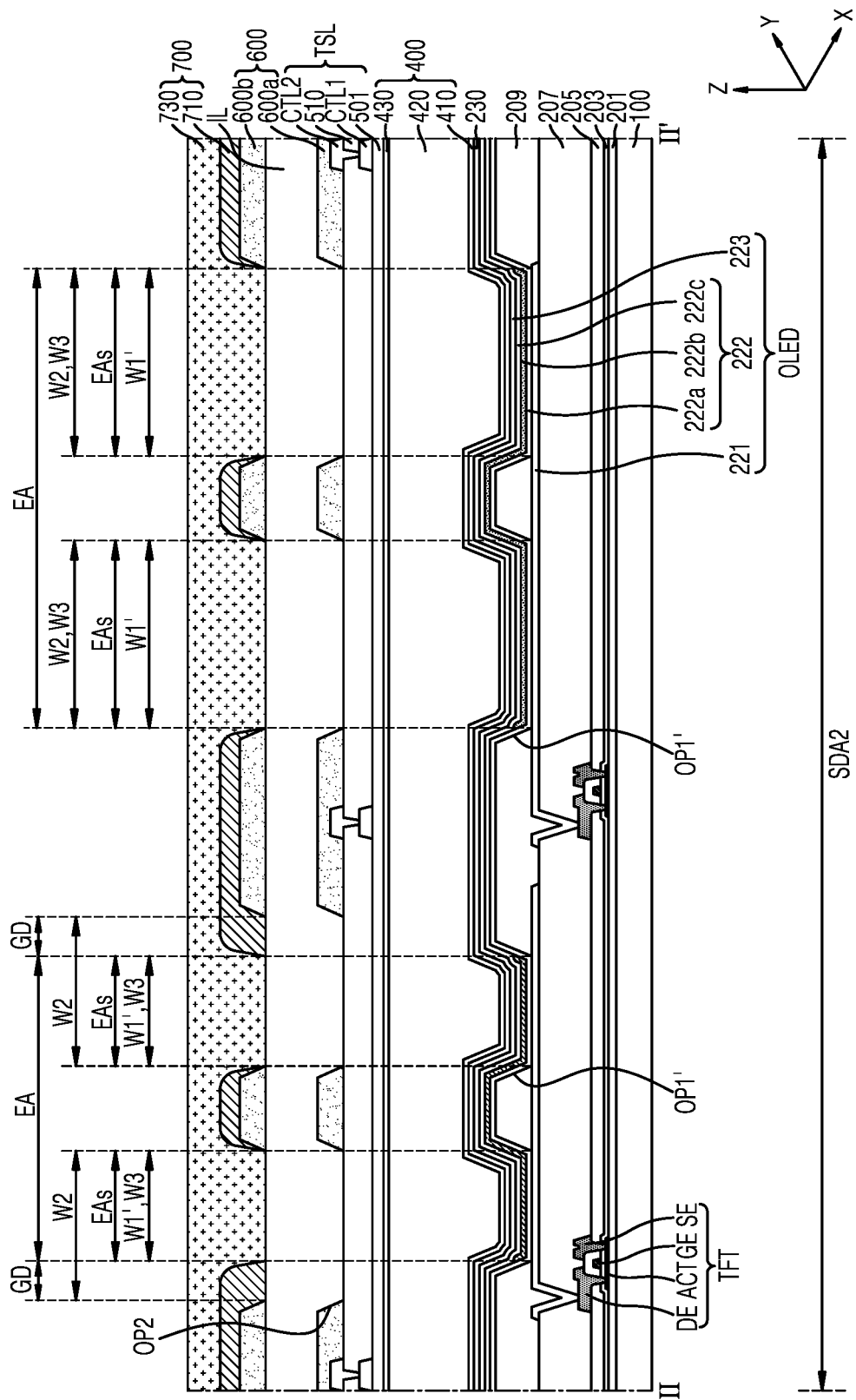
Figure 10:
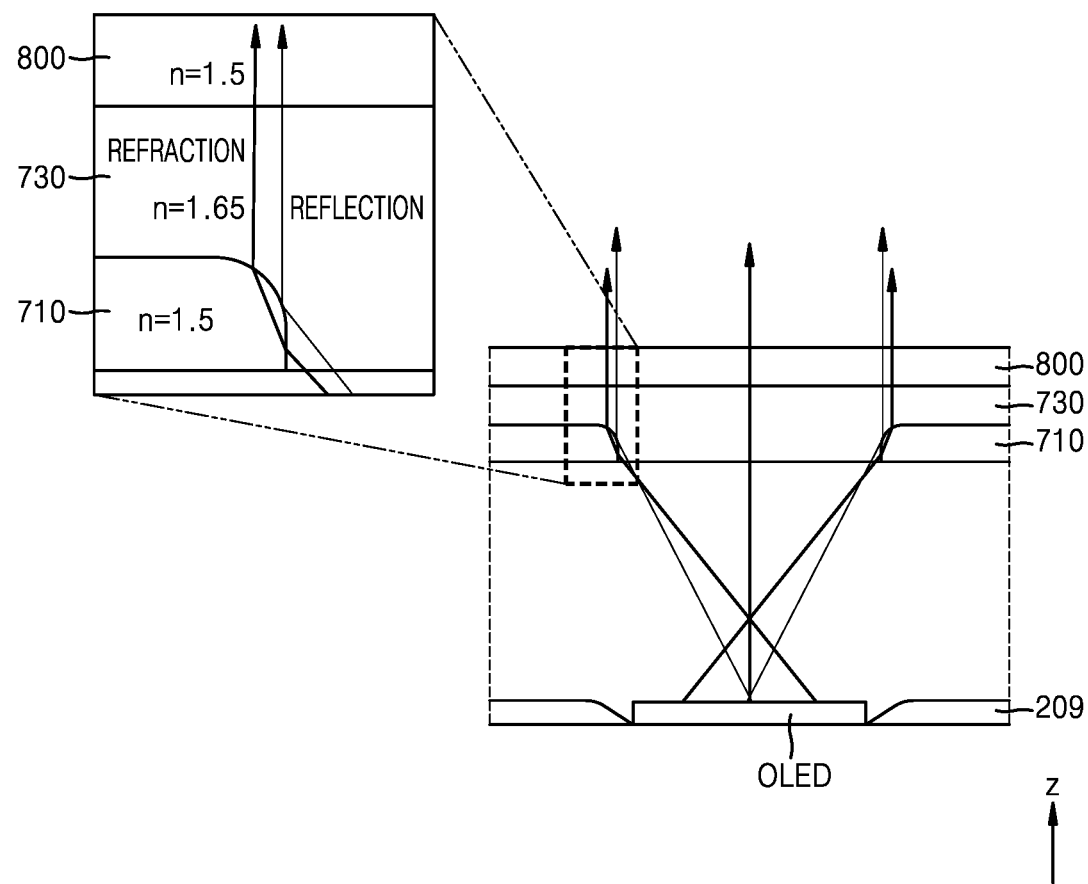
FIG. 10 describes a refractive layer according to an embodiment.
Figure 11A:
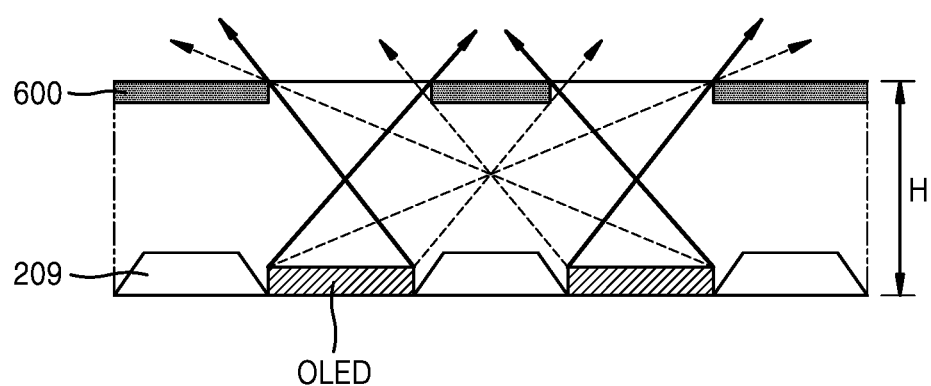
FIGS. 11A and 11B describe light-blocking layers according to an embodiment.
Figure 11A:
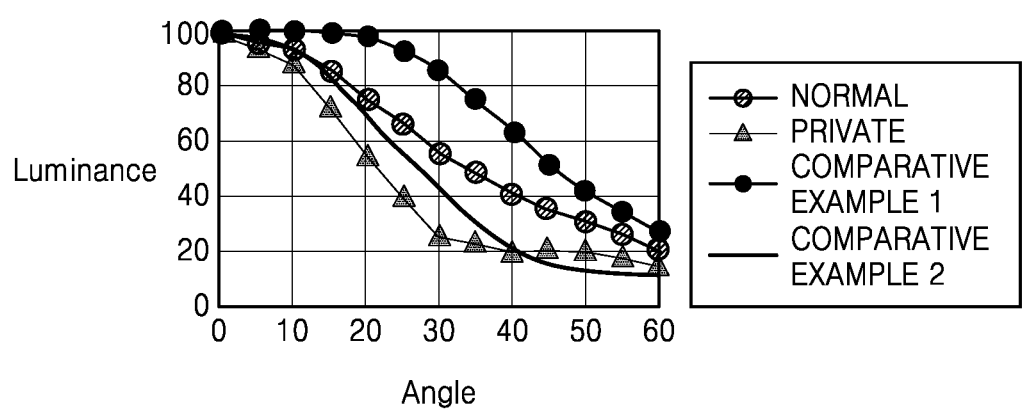
Figure 11B:
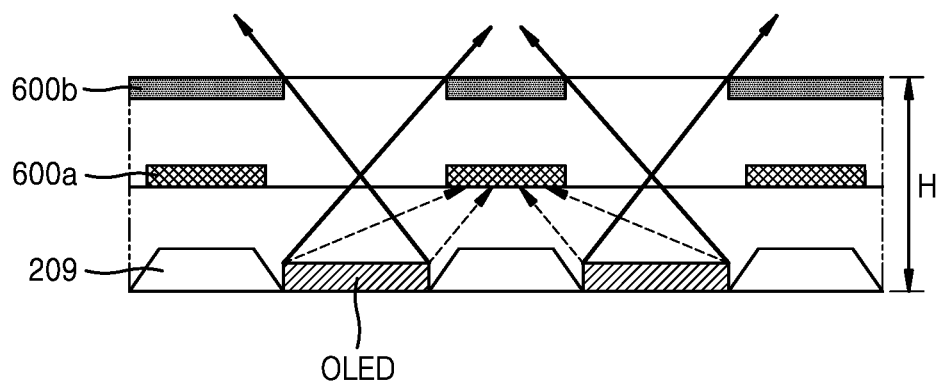
Figure 11B:
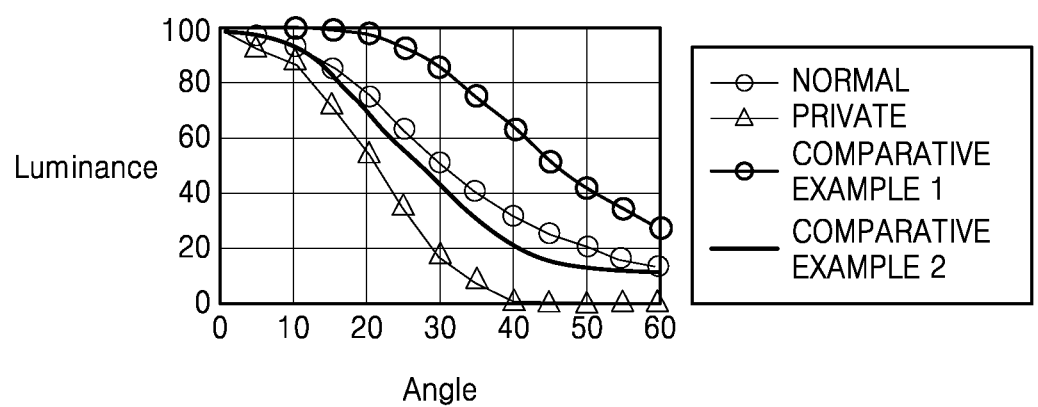

FIGS. 4 and 5 are schematic plan views of a portion of a display area in a display layer of a display apparatus according to an embodiment. FIG. 6 is a schematic plan view of a portion of a display area in a display layer and a light-blocking layer on the display layer of a display apparatus according to an embodiment. FIG. 7 is a cross-sectional view of the display area taken along line I-I' of FIG. 6. FIGS. 8 and 9 are cross-sectional views of the display area taken along line II-II' of FIG. 6. FIG. 10 is a schematic view describing a refractive layer according to an embodiment. FIGS. 11A and 11B are views for describing a light-blocking layer according to an embodiment.

FIG. 7 illustrates the third pixel PX3 in the first pixel group PG1 of the first sub-display area SDA1. FIG. 8 illustrates the second pixel PX2 and the third pixel PX3 in the second pixel group PG2 of the second sub-display area SDA2.

As illustrated in FIGS. 7 and 8, the display apparatus according to an embodiment may include a display panel. A cover window 900 protecting the display panel may be disposed above the display panel. The display panel may include the substrate 100, the display layer on the substrate 100, a touch sensing layer TSL, a light-blocking layer 600, a refractive layer 700, and an optical layer 800. The display layer may include a pixel circuit including a thin-film transistor TFT, an organic light-emitting diode OLED which is a display element, and a thin-film encapsulation layer 400. Insulating layers may be disposed between the substrate 100 and the thin-film encapsulation layer 400.

The substrate 100 may include a single layer including a glass material. In other examples, the substrate 100 may include polymer resins. The substrate 100 including polymer resins may have a multi-layered structure in which organic layers and inorganic layers including polymer resins are stacked. The substrate 100 may include a rigid substrate or a flexible substrate, which may be bent, folded, or rolled.

The thin-film transistor TFT may include a semiconductor layer ACT including amorphous silicon, polycrystalline silicon, or an organic semiconductor material such as an oxide semiconductor, a gate electrode GE, a source electrode SE, and a drain electrode DE. A gate insulating layer 203 including an inorganic material, such as silicon oxide, silicon nitride, and/or silicon oxynitride, may be disposed between the semiconductor layer ACT and the gate electrode GE. An interlayer insulating layer 205 including an inorganic material, such as silicon oxide, silicon nitride, and/or silicon oxynitride, may be disposed on the gate electrode GE, and the source electrode SE and the drain electrode DE may be disposed on the interlayer insulating layer 205.

The gate electrode GE, the source electrode SE, and the drain electrode DE may include a variety of conductive materials. The gate electrode GE may include at least one of Mo, Al, Cu, and Ti and may have a single layer structure or a multi-layered structure. For example, the gate electrode GE may include a Mo single layer or a three-layered structure including a Mo layer, an Al layer, and a Mo layer. The source electrode SE and the drain electrode DE may include at least one of Cu, Ti, and Al and may have a multi-layered structure if necessary. For example, the source electrode SE and the drain electrode DE may include a three-layered structure including a Ti layer, an Al layer, and a Ti layer.

A buffer layer 201 including an inorganic material, such as silicon oxide, silicon nitride, and/or silicon oxynitride, may be disposed between the thin film transistor TFT and the substrate 100.

A planarization insulating layer 207 may be disposed on the thin-film transistor TFT. The planarization insulating layer 207 may include, for example, an organic material, such as acryl, benzocyclobutene (BCB), or hexamethyldisiloxane (HMDSO). The planarization layer 208 may include a single layer or may include multiple layers.

As illustrated in FIG. 4, pixel electrodes 221 may be disposed on the planarization insulating layer 207 in the first sub-display area SDA1 and the second sub-display area SDA2. The pixel electrode 221 may be disposed for each pixel. The pixel electrodes 221 respectively corresponding to adjacent pixels may be disposed to be spaced apart from each other.

The pixel electrodes 221 may be reflection electrodes. In some embodiments, the pixel electrode 221 may include a reflective layer including Ag, Mg, Al, Pt, Pd, Au, Ni, Nd, Ir, Cr, and/or a compound thereof, and a transparent or semi-transparent electrode layer on the reflective layer. The transparent or semi-transparent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 221 may have a three-layered structure including an ITO layer, an Ag layer, and an ITO layer.

A pixel-defining layer 209 may be disposed on the pixel electrode 221. The pixel-defining layer 209 may include an organic insulating material, such as polyimide, polyamide, acryl resins, BCB, HMDSO, phenol resins, etc. In other examples, the pixel-defining layer 209 may include an inorganic insulating material. In other examples, the pixel-defining layer 209 may have a multi-layered structure including an inorganic insulating material and an organic insulating material.

As illustrated in FIGS. 5 and 7, in the first sub-display area SDA1, the pixel-defining layer 209 may cover an edge of the pixel electrode 221 of each of the first through third pixels PX1 through PX3 of the first pixel group PG1 and may include an opening OP1 exposing a portion of the pixel electrode 221 of each of the first through third pixels PX1 through PX3. In the first sub-display area SDA1, the pixel defining layer 209 may define an opening OP1 for each pixel electrode 221.

As illustrated in FIGS. 5 and 8, in the second sub-display area SDA2, the pixel-defining layer 209 may include openings OP1' exposing portions of the pixel electrode 221 of each of the first through third pixels PX1 through PX3 of the second pixel group PG2. In the second sub-display area SDA2, the pixel-defining layer 209 may define the openings OP1' exposing the portions of the pixel electrode 221. Accordingly, an emission area EA of each of the first through third pixels PX1 through PX3 in the second sub-display area SDA2 may include sub-emission areas EAs divided by the pixel-defining layer 209. A non-emission area may be included between the sub-emission areas EAs in the second sub-display area SDA2.

With respect to the pixels emitting the same color in the first sub-display area SDA1 and the second sub-display area SDA2, the width W1' of the opening OP1' of the pixel-defining layer 209 in the second sub-display area SDA2 may be less than the width W1 of the opening OP1 of the pixel-defining layer 209 in the first sub-display area SDA1. For example, the width W1' of the opening OP1' of the pixel-defining layer 209 around the pixel electrode 221 of the third pixel PX3 disposed in the second sub-display area SDA2 may be less than the width W1 of the opening OP1 of the pixel-defining layer 209 around the pixel electrode 221 of the third pixel PX3 disposed in the first sub-display area SDA1. Hereinafter, the boundary at which the pixel-defining layer 209 and the pixel electrode 221 contact each other may be referred to as the edge of the openings OP1 and OP1'.

An emission layer 222b may be disposed in the openings OP1 and OP1' of the pixel-defining layer 209. The emission layer 222b may include an organic material including a fluorescent or phosphorescent material for emitting red, green, or blue light. The organic material described above may include a low-molecular weight organic material or a high-molecular weight organic material. According to an embodiment, in the second sub-display area SDA2, the emission layer 222b may also be disposed on the pixel-defining layer 209 dividing the emission area EA. The emission layer 222b on the pixel-defining layer 209 that is located on the non-emission area between the sub-emission areas EAs, may be discontinuous.

A first common layer 222a and a second common layer 222c may be disposed below and above the emission layer 222b, respectively. The first common layer 222a may include, for example, a hole transport layer (HTL), or an HTL and a hole injection layer (HIL). The second common layer 222c may be disposed above the emission layer 222b and may include an electron transport layer (ETL) and/or an electron injection layer (EIL). The second common layer 222c may be optional. In some embodiments, the second common layer 222c may not be provided.

The emission layer 222b may be arranged to correspond to the openings OP1 and OP1' of the pixel-defining layer 209 for each pixel. However, like an opposite electrode 223 to be described below, each of the first common layer 222a and the second common layer 222c may be an integrally formed common layer that covers the entire substrate 100 (the display area of the substrate 100).

The opposite electrode 223 may include a metal having a low work function, an alloy, an electrically conductive compound, or a combination thereof. The opposite electrode 223 may include a transmissive electrode, a transflective electrode, or a reflection electrode. The opposite electrode 223 may include Li, Ag, Mg, Al, Al—Li, Ca, Mg—In, Mg—Ag, Yb, Ag—Yb, ITO, IZO, or a combination thereof. The opposite electrode 223 may have a single-layered structure including a single layer or a multi-layered structure including layers.

A capping layer 230 may increase the efficiency of external emission of the organic light-emitting diode OLED by constructive interference. The capping layer 230 may include a material having a refractive index (at about 589 nm) that is equal to or greater than about 1.6. The capping layer 230 may include an organic capping layer including an organic material, an inorganic capping layer including an inorganic material, or a complex capping layer including an organic material and an inorganic material.

A thin-film encapsulation layer 400 may be disposed on the capping layer 230. The thin-film encapsulation layer 400 may include at least one inorganic encapsulation layer and at least one organic encapsulation layer. For example, the thin-film encapsulation layer 400 may include a first inorganic encapsulation layer 410, an organic encapsulation layer 420, and a second inorganic encapsulation layer 430.

The touch sensing layer TSL may be disposed on the thin-film encapsulation layer 400. The touch sensing layer TSL may sense a user's touch input by using at least one of such touch methods as a resistive layer method, a capacitance method, and etc. The touch sensing layer TSL may include a first sub-conductive layer CTL1, a second sub-conductive layer CTL2, and a touch insulating layer 510. The touch sensing layer TSL may include a touch buffer layer 501.

The touch buffer layer 501 may be directly formed on the thin-film encapsulation layer 400. The touch buffer layer 501 may include an inorganic material, such as silicon oxide, silicon nitride, and/or silicon oxynitride, or an organic material, and may include a single layer or multiple layers.

The first sub-conductive layer CTL1, the touch insulating layer 510, and the second sub-conductive layer CTL2 may be sequentially stacked on the touch buffer layer 501. The first sub-conductive layer CTL1 and the second sub-conductive layer CTL2 may be disposed below and above the touch insulating layer 510, respectively. In some embodiments, the second sub-conductive layer CTL2 may operate as a sensing portion that senses a contact, and the first sub-conductive layer CTL1 may connect the patterned second sub-conductive layer CTL2 in one direction. In other embodiments, the first sub-conductive layer CTL1 may operate as a sensing portion that senses a contact, and the second sub-conductive layer CTL2 may connect the patterned first sub-conductive layer CTL1 in one direction.

In some embodiments, both of the first sub-conductive layer CTL1 and the second sub-conductive layer CTL2 may function as a sensing portion. The first sub-conductive layer CTL1 and the second sub-conductive layer CTL2 may contact each other through a contact hole formed in the touch insulating layer 510. When both of the first sub-conductive layer CTL1 and the second sub-conductive layer CTL2 are used as the sensing portion, the resistance of the touch electrode may be reduced, and the response speed of the touch sensing layer TSL may be increased.

In some embodiments, the first sub-conductive layer CTL1 and the second sub-conductive layer CTL2 may be formed to have a mesh structure so that light emitted from the organic light-emitting diode OLED may be transmitted through the first and second sub-conductive layers CTL1 and CTL2. Accordingly, the first sub-conductive layer CTL1 and the second sub-conductive layer CTL2 may overlap the pixel-defining layer 209 and not overlap the emission area EA of the organic light-emitting diode OLED. The first sub-conductive layer CTL1 and the second sub-conductive layer CTL2 may not be disposed on the pixel-defining layer 209 overlapping the non-emission area between the sub-emission areas EAs, in the second sub-display area SDA2. The first sub-conductive layer CTL1 and the second sub-conductive layer CTL2 may include a metal layer or a transparent conductive layer.

The light-blocking layer 600 may be disposed on the touch sensing layer TSL. The light-blocking layer 600 may be disposed on the touch insulating layer 510. The light-blocking layer 600 may not be disposed in the first sub-display area SDA1 and may be disposed only in the second sub-display area SDA2. A portion of the light-blocking layer 600 may overlap the second sub-conductive layer CTL2 and may be disposed to cover the second sub-conductive layer CTL2. The light-blocking layer 600 may have openings OP2 corresponding to the sub-emission areas EAs of the organic light-emitting diode OLED. The openings OP2 of the light-blocking layer 600 may overlap the openings OP1' of the pixel-defining layer 209. Hereinafter, a boundary where the light-blocking layer 600 contacts an insulating layer disposed below the light-blocking layer 600 (for example, the touch insulating layer 510) is referred to as the edge of the openings OP2.

As illustrated in FIGS. 6 and 8, with respect to some pixels in the second sub-display area SDA2, the width W2 of the opening OP2 of the light-blocking layer 600 may be greater than the width W1' of the opening OP1' of the pixel-defining layer 209. With respect to other pixels in the second sub-display area SDA2, the width W2 of the opening OP2 of the light-blocking layer 600 may correspond to the width W1' of the opening OP1' of the pixel-defining layer 209. For example, in a plan view, with respect to the first pixel PX1 and the second pixel PX2, the edge of the opening OP2 of the light-blocking layer 600 may be spaced apart from the edge of the opening OP1 of the pixel-defining layer

209 by a space distance GD, and with respect to the third pixel PX3, the edge of the opening OP2 of the light-blocking layer 600 and the edge of the opening OP1 of the pixel-defining layer 209 may coincident with each other and may have substantially the same shapes.

The refractive layer 700 may be disposed on the light-blocking layer 600. The light-blocking layer 600 may be provided between a first refractive layer 710 and the touch sensing layer TSL. The refractive layer 700 may include the first refractive layer 710 and a second refractive layer 730.

The first refractive layer 710 may be disposed to correspond to the display area DA of the substrate 100 and may include openings OP3 corresponding to the sub-emission areas EAs or the openings OP1' in the second sub-display area SDA2. The openings OP3 of the first refractive layer 710 may overlap the openings OP1' of the pixel-defining layer 209 and the openings OP2 of the light-blocking layer 600. Hereinafter, a boundary at which the first refractive layer 710 and an insulating layer therebelow, for example, the touch insulating layer 510, contact each other is referred to as an edge of the openings OP3.

As illustrated in FIG. 8, a width W3 of the openings OP3 of the first refractive layer 710 in the second sub-display area SDA2 may correspond to the width W1 of the opening OP1 of the pixel-defining layer 209. In a plan view, the edge of the opening OP3 of the first refractive layer 710 may correspond to (coincide with) the edge of the opening OP1 of the pixel-defining layer 209 and may have substantially the same shape as the edge of the opening OP1 of the pixel-defining layer 209. In FIG. 6, a shape of the opening OP2 is square. However, in other examples, the shape of the opening OP2 may be circular, oval, or polygonal, for example, triangular. The polygonal shape may include rounded edges.

The first refractive layer 710 may have a first refractive index of about 1.40 through about 1.59. The first refractive layer 710 may include a light-transmissive inorganic material or organic material having a low refractive index.

The second refractive layer 730 may fill the opening OP3 of the first refractive layer 710 and may be disposed on the first refractive layer 710. The second refractive layer 730 may cover the entire upper surface of the substrate 100 and may substantially planarize the upper surface of the substrate 100. The second refractive layer 730 may have a second refractive index that is higher than the first refractive index of the first refractive layer 710. For example, the second refractive layer 730 may have a refractive index that is equal to or greater than about 1.6, i.e., a refractive index of about 1.6 through about 1.8. According to an embodiment, the first refractive layer 710 and the second refractive layer 730 may have a refractive index difference of about 0.1 through about 0.3. The second refractive layer 730 may include a light-transmissive inorganic material or organic material having a high refractive index.

In the second sub-display area SDA2, the refractive layer 700 may change a path of light emitted from the organic light-emitting diode OLED of the pixels disposed in the second sub-display area SDA2, and thus, may increase the front visibility and the emission efficiency of the display apparatus. FIG. 10 illustrates an example in which each of the first refractive layer 710 and the optical layer 800 has a refractive index of about 1.5, and the second refractive layer 730 has a refractive index of about 1.65. As illustrated in FIG. 10, light progressing in a lateral direction from the organic light-emitting diode OLED, for example, a direction other than a third direction (a z direction), may be refracted and/or reflected at a boundary surface of the first refractive layer 710 and the second refractive layer 730. The light may progress approximately in the third direction (the z direction). Through this concentration effect, in a private driving mode, when the display apparatus is viewed from an oblique angle of the display apparatus, for example, the left, the right, the top, or the bottom of the display, the user's viewing angle may become narrower or may be blocked.

In the second sub-display area SDA2, a body portion of the first refractive layer 710 may overlap a body portion of the light-blocking layer 600 and a body portion of the pixel-defining layer 209. For example, the body portion of the first refractive layer 710 may overlap only the body portion of the light-blocking layer 600 and the body portion of the pixel-defining layer 209. The body portion of the first refractive layer 710 may be distinguishable from the opening OP3 of the first refractive layer 710 and may have a selected volume. The body portion of the light-blocking layer 600 may be distinguishable from the opening OP2 of the light-blocking layer 600 and may have a selected volume. The body portion of the pixel-defining layer 209 may be distinguished from the openings OP1 and OP1' of the pixel-defining layer 209 and may have a selected volume.

The light-blocking layer 600 may include multiple layers, for example, two or more layers. For example, as illustrated in FIG. 9, the light-blocking layer 600 may include a first light-blocking layer 600a and a second light-blocking layer 600b above the first light-blocking layer 600a. The first light-blocking layer 600a may be disposed on the touch insulating layer 510 of the touch sensing layer TSL, may overlap the second sub-conductive layer CTL2, and may be disposed to cover the second sub-conductive layer CTL2. The second light-blocking layer 600b may overlap the first light-blocking layer 600a, and each of the first light-blocking layer 600a and the second light-blocking layer 600b may have the openings OP2 corresponding to the sub-emission areas EAs. An insulating layer IL may be disposed between the first light-blocking layer 600a and the second light-blocking layer 600b, and the refractive layer 700 may be disposed above the second light-blocking layer 600b.

The refractive layer 700 may include the first refractive layer 710 and the second refractive layer 730. The first refractive layer 710 may cover the second light-blocking layer 600b and may be disposed on the insulating layer IL and the second light-blocking layer 600b. The first refractive layer 710 may include the openings OP3 corresponding to the sub-emission areas EAs or the openings OP1' in the second sub-display area SDA2. The openings OP3 of the first refractive layer 710 may overlap the openings OP1' of the pixel-defining layer 209 and the openings OP2 of the light-blocking layer 600. The insulating layer IL may include a light transmissive inorganic or organic material. According to an embodiment, the insulating layer IL and the first refractive layer 710 may include the same material. The second refractive layer 730 may fill the openings OP3 of the first refractive layer 710 and may be disposed on the first refractive layer 710.

FIG. 11A illustrates the brightness characteristics of an oblique angle with respect to the front surface of the display apparatus, when the light-blocking layer includes a single layer, and FIG. 11B illustrates the brightness characteristics of an oblique angle with respect to the front surface of the display apparatus, when the light-blocking layer includes multiple layers. Comparative Example 1 corresponds to a display apparatus including an organic light-emitting diode OLED not including a light-blocking layer, and Comparative Example 2 corresponds to an in-plane switching (IPS) mode-liquid crystal display apparatus.

As illustrated in FIGS. 11A and 11B, when the light-blocking layer includes a single layer or multiple layers as in the embodiments, compared to the Comparative Examples 1 and 2, the reduction in visibility from the side view may be greater in the private driving mode according. Also, compared to the light-blocking layer including a single layer, the light-blocking layer including multiple layers may further reduce visibility from the side view in the private driving mode.

Referring to FIGS. 7 and 8, the optical layer 800 and the cover window 900 may be sequentially disposed on the refractive layer 700. The optical layer 800 may include a polarizing layer including a polarization plate or a polarization film.

In the embodiment of FIG. 6, the pixels PX may be arranged in a PENTILE™ structure. Based on the PENTILE™ structure, the first pixels PX1 and the third pixels PX3 may be disposed in a column in the second direction and alternate with each other. The second pixels PX may be disposed in adjacent columns in the second direction and may repeat in their columns.

The pixels PX may be divided into the first pixel group PG1 and the second pixel group PG2 and may be alternately and repeatedly arranged in the first direction and the second direction. The first through third pixels PX1 through PX3 included in the first pixel group PG1 and the second pixel group PG2 may have polygonal shapes, including square shapes. In the embodiments, the polygonal shapes or the square shapes may have rounded vertexes. The first through third pixels PX1 through PX3 may have the square shapes having rounded vertexes (corners). In other examples, the first through third pixels PX1 through PX3 may have circular or oval shapes.

In each of the first pixel group PG1 and the second pixel group PG2, the first through third pixels PX1 through PX3 may have different sizes from each other. For example, an area of the second pixel PX2 may be smaller than areas of the first pixel PX1 and the third pixel PX3, and the area of the third pixel PX3 may be greater than the area of the first pixel PX1. However, embodiments are not limited thereto. Various modifications are possible. For example, in each of the first pixel group PG1 and the second pixel group PG2, the first through third pixels PX1 through PX3 may have substantially the same sizes as each other.

Figure 12:
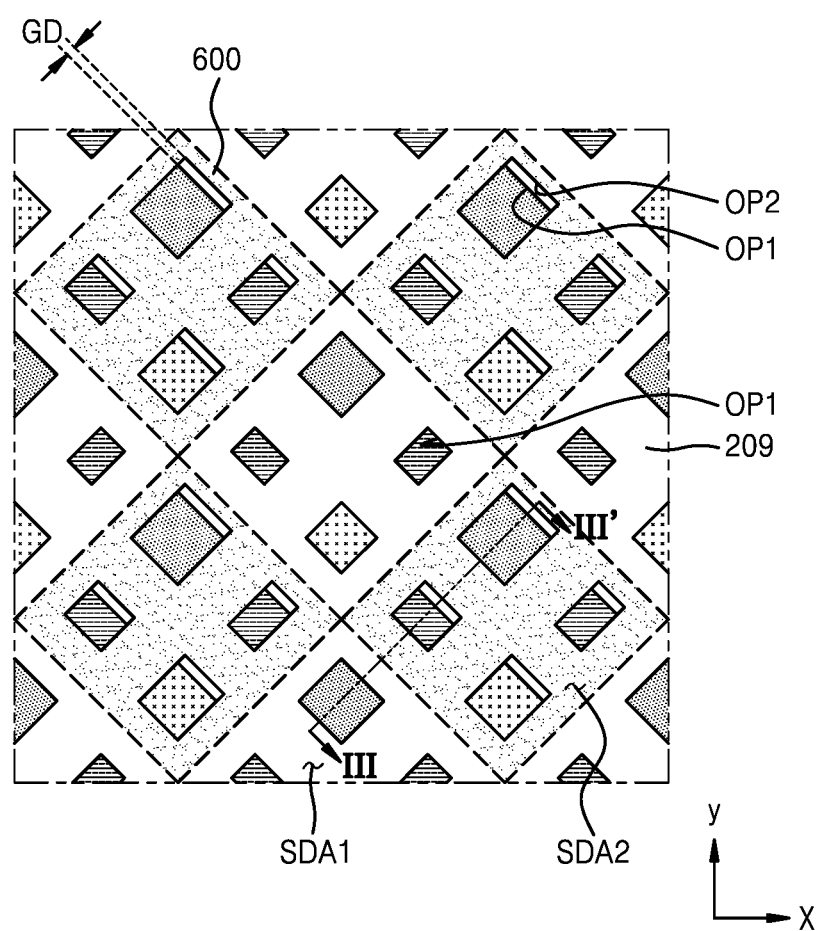
FIG. 12 is a schematic plan view of a portion of a display area in a display layer and a light-blocking layer of a display apparatus according to an embodiment.
Figure 13:
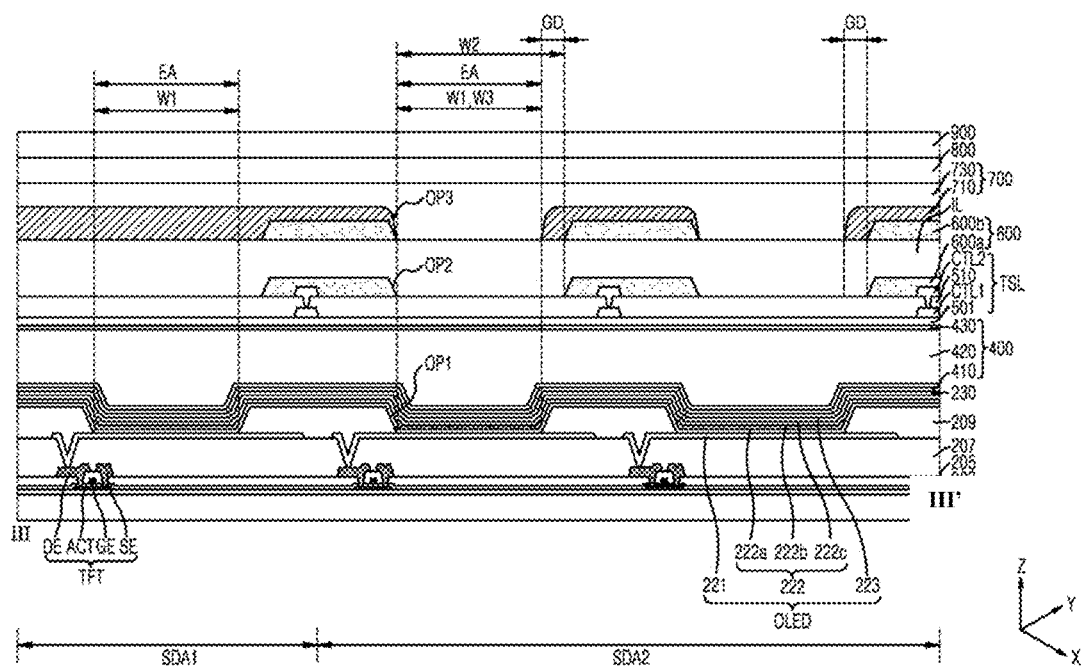
FIG. 13 is a schematic cross-sectional view of the display area taken along line III-III' of FIG. 12.

FIG. 12 is a schematic plan view of a portion of a display area in a display layer and a light-blocking layer on the display layer of a display apparatus according to an embodiment. FIG. 13 is a cross-sectional view of the display area taken along line III-III' of FIG. 12. The embodiment of FIG. 12 differs from the embodiment of FIG. 6 in that the emission areas EA in the second sub-display area SDA2 are not divided by the pixel-defining layer 209.

Sizes of the first through third pixels PX1 through PX3 in the second pixel group PG2 disposed in the second sub-display area SDA2 may be greater than sizes of the first through third pixels PX1 through PX3 in the first pixel group PG1 disposed in the first sub-display area SDA1, respectively. For example, the size of the first pixel PX1 disposed in the second sub-display area SDA2 may be greater than the size of the first pixel PX1 disposed in the first sub-display area SDA1. The size of the pixel may be a size of the emission area or the pixel electrode. In other examples, sizes of the first through third pixels PX1 through PX3 in the second pixel group PG2 disposed in the second sub-display area SDA2 may be substantially the same as sizes of the first through third pixels PX1 through PX3 in the first pixel group PG1 disposed in the first sub-display area SDA1, respectively.

As illustrated in FIGS. 12 and 13, the pixel-defining layer 209 may have an opening OP1 for each pixel, the opening OP1 corresponding to the emission area EA, in the first sub-display area SDA1 and the second sub-display area SDA2. The pixel-defining layer 209 may surround the emission area EA of the organic light-emitting diode OLED of each pixel.

In the second sub-display area SDA2, the light-blocking layer 600 may include multiple layers, for example, two or more layers, and in a cross-sectional view, the multiple layers of the light-blocking layer 600 may be arranged to be spaced apart from each other in a third direction by an insulating layer. The embodiment of FIG. 12 shows an example in which the light-blocking layer 600 has a double-layered structure including the first light-blocking layer 600a and the second light-blocking layer 600b. The insulating layer IL between the first light-blocking layer 600a and the second light-blocking layer 600b may include a light transmissive inorganic or organic material.

The opening OP2 of each of the first light-blocking layer 600a and the second light-blocking layer 600b may overlap the opening OP1 of the pixel-defining layer 209. The size of the opening OP2 may be greater than a size of the opening OP1. In a plan view, the upper, lower, and left edges of the opening OP2 may correspond to (coincide with) upper, lower, and left edges of the opening OP1, respectively, and a right edge of the opening OP2 may be spaced apart from a right edge of the opening OP1. As the right edge of the opening OP2 may be spaced apart from the emission area EA, the right edge of the opening OP2 and the right edge of the opening OP1 may be spaced apart from each other by a space distance GD. Accordingly, a width W2 of the opening OP2 of each of the first light-blocking layer 600a and the second light-blocking layer 600b may be greater than a width W1 of the opening OP1 of the emission area EA or the pixel-defining layer 209, in a diagonal direction between the first direction and the second direction.

According to an embodiment, the user's view may be visible from a selected direction (or angle), for example, from a diagonal direction from the right side in FIG. 12, but from other side view directions, the view may be blocked.

According to the embodiments described above, the display apparatus may be selectively driven in a normal driving mode or a private driving mode, and in the private driving mode, only the pixels in the second sub-display area SDA2 of the display apparatus may emit light, and reduce the viewing angle. In other examples, the display apparatus may operate in a single driving mode, and the display apparatus may be designed to minimize or block the viewing angle when the display apparatus is viewed from a side direction.

Figure 14:
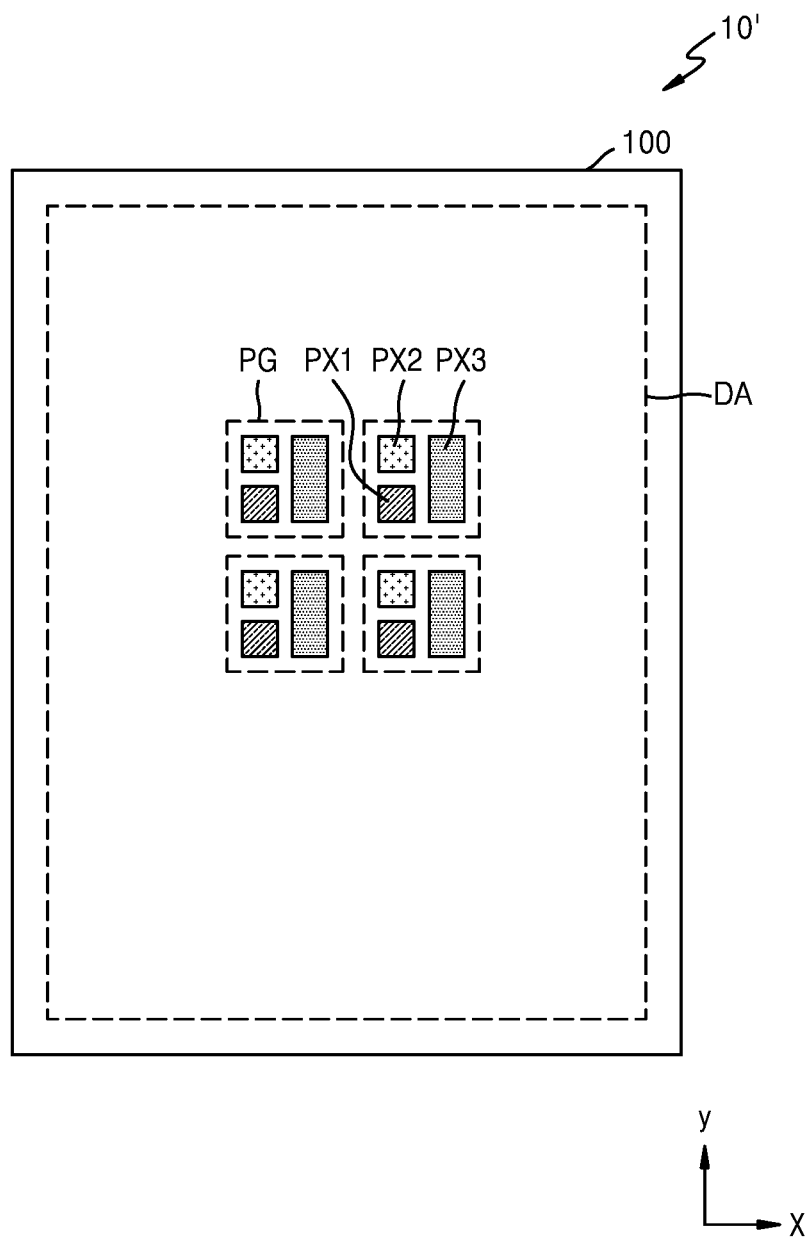
FIG. 14 is a schematic plan view of a display apparatus according to an embodiment.
Figure 15:
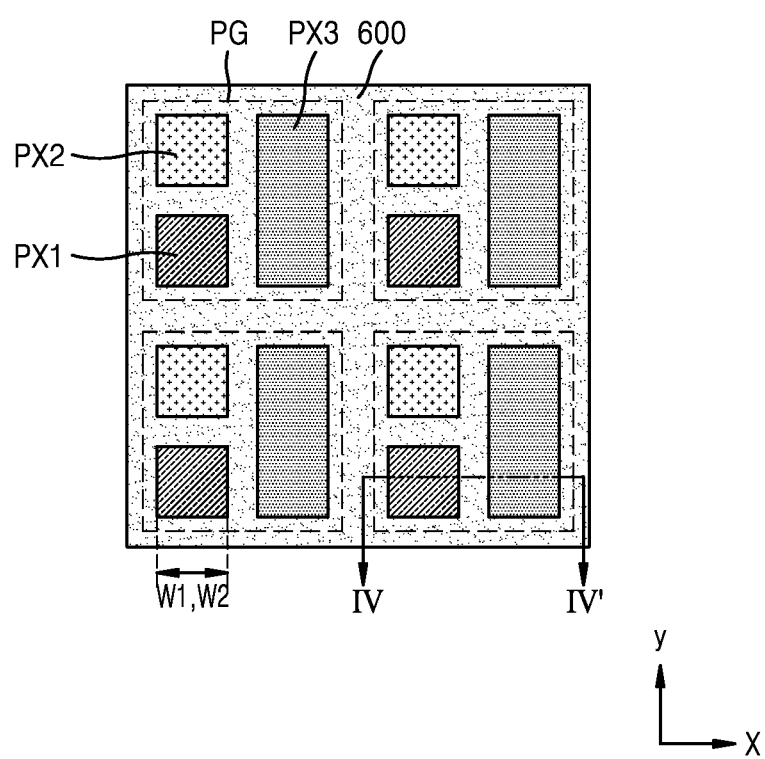
FIG. 15 is a schematic plan view of a portion of a display area of FIG. 14.
Figure 16:
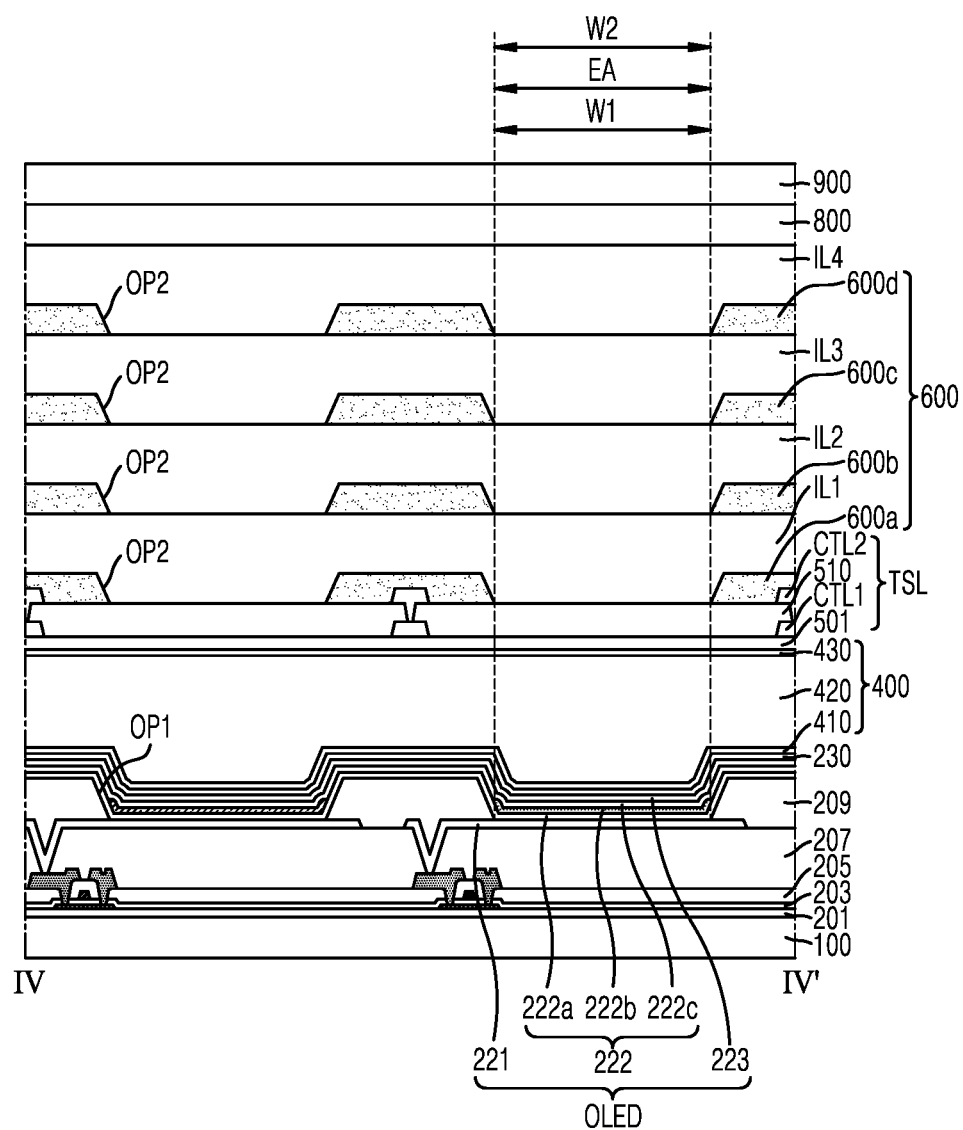
FIG. 16 is a schematic cross-sectional view of the display area taken along line IV-IV' of FIG. 15.
Figure 17:
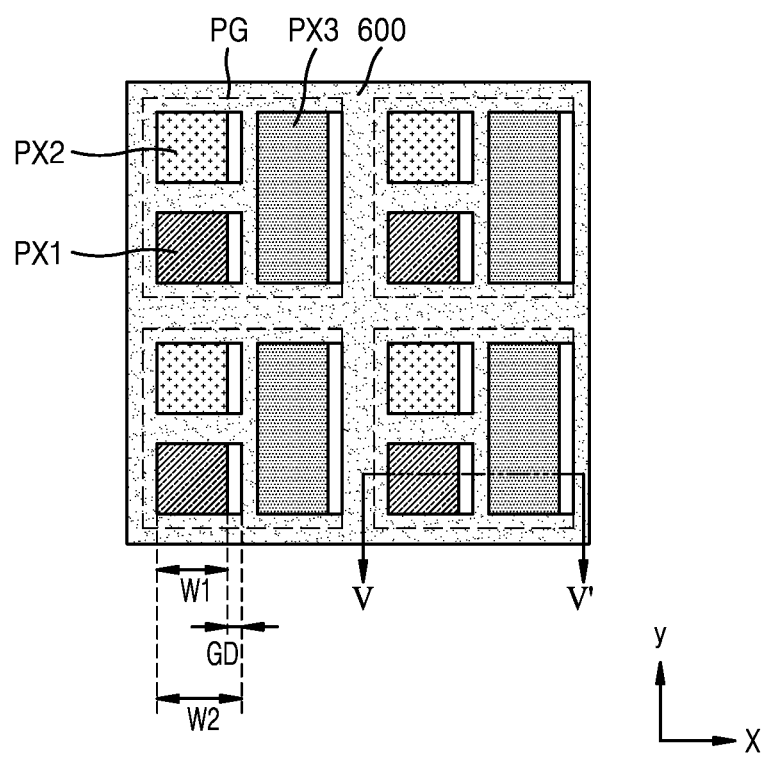
FIG. 17 is a schematic plan view of a portion of a display area of FIG. 14.
Figure 18:
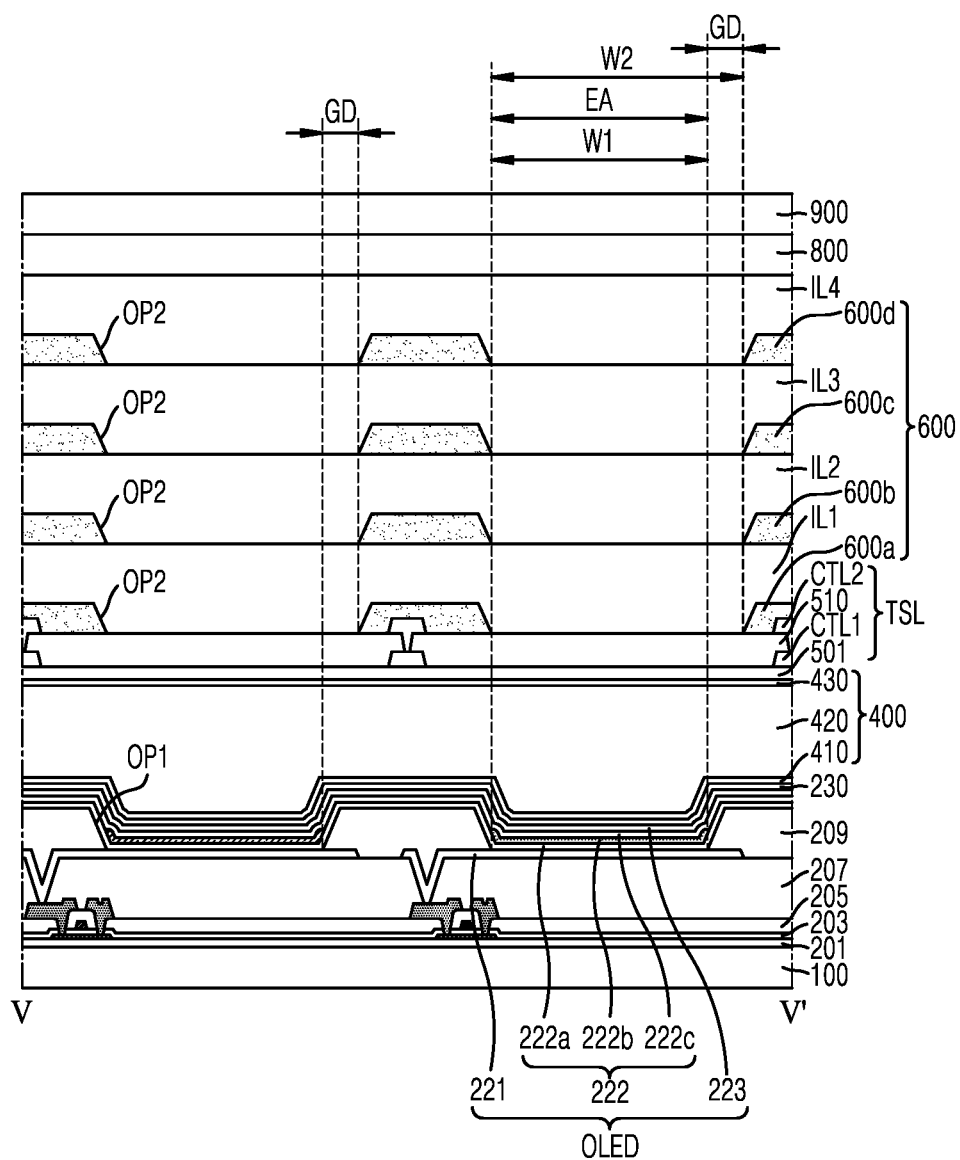
FIG. 18 is a schematic cross-sectional view of the display area taken along line V-V of FIG. 17.
Figure 19:
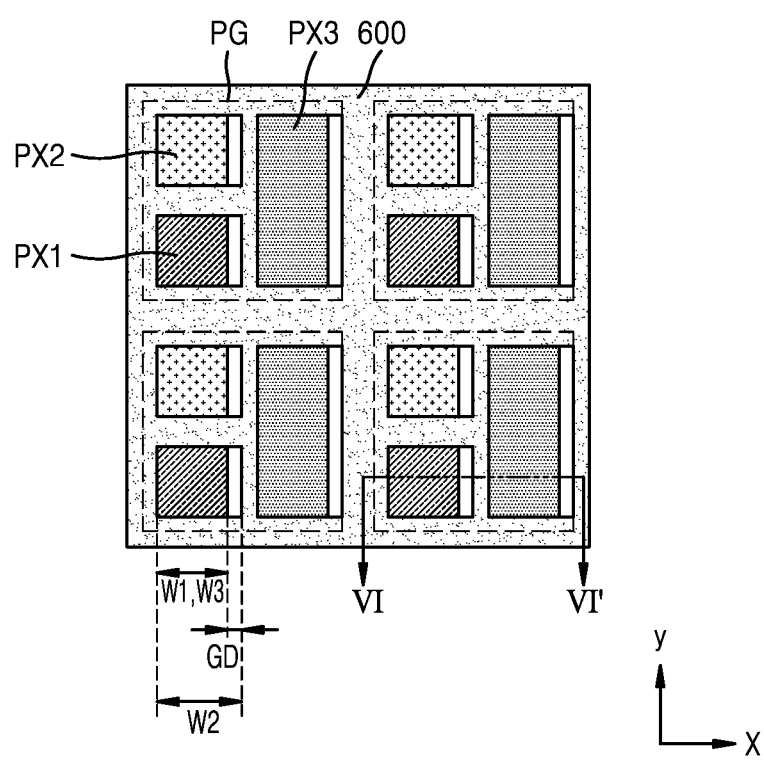
FIG. 19 is a schematic plan view of a portion of a display area of FIG. 14.
Figure 20:
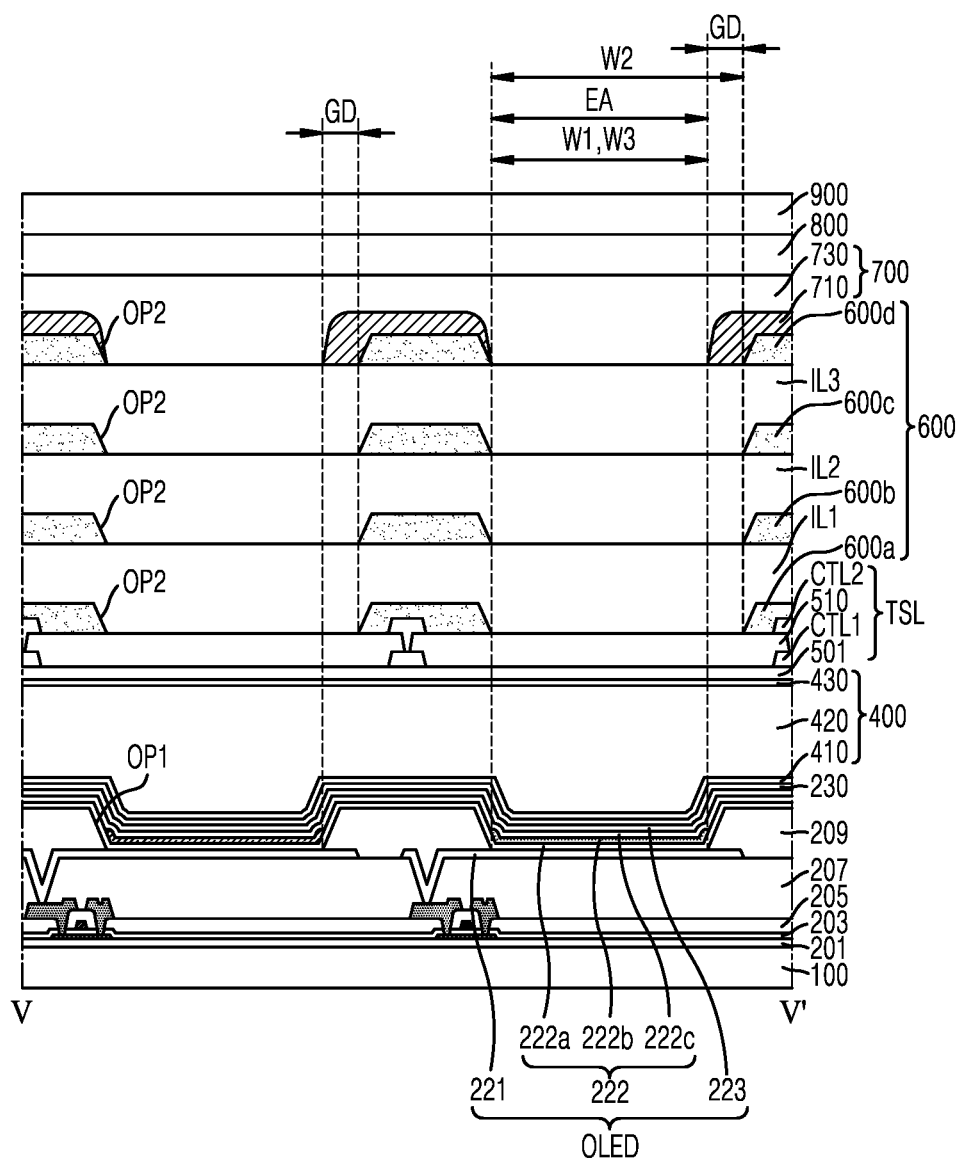
FIG. 20 is a schematic cross-sectional view of the display area taken along line VI-VI' of FIG. 19.
Figure 21:
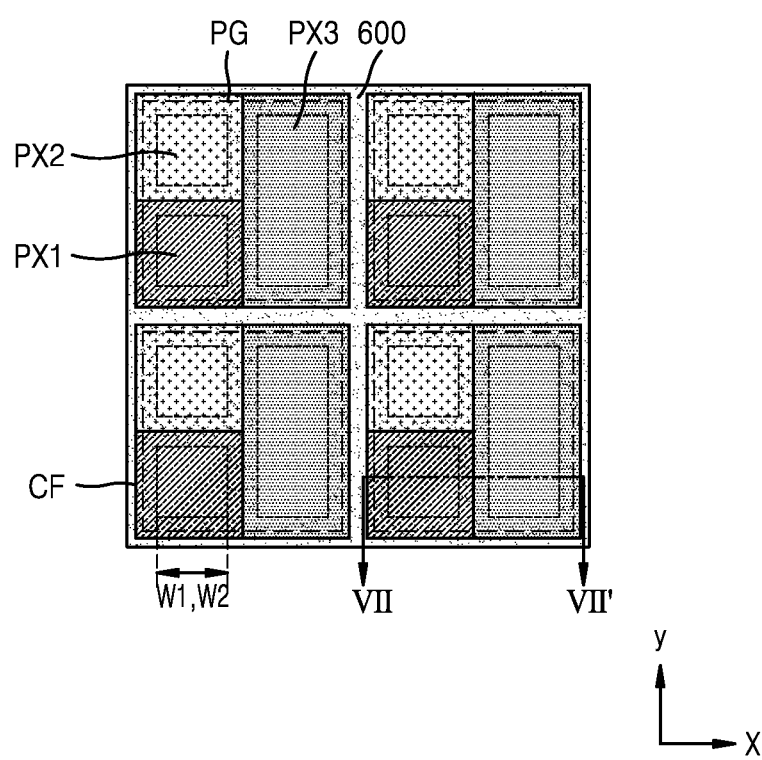
FIG. 21 is a schematic plan view of a portion of a display area of FIG. 14.
Figure 22:
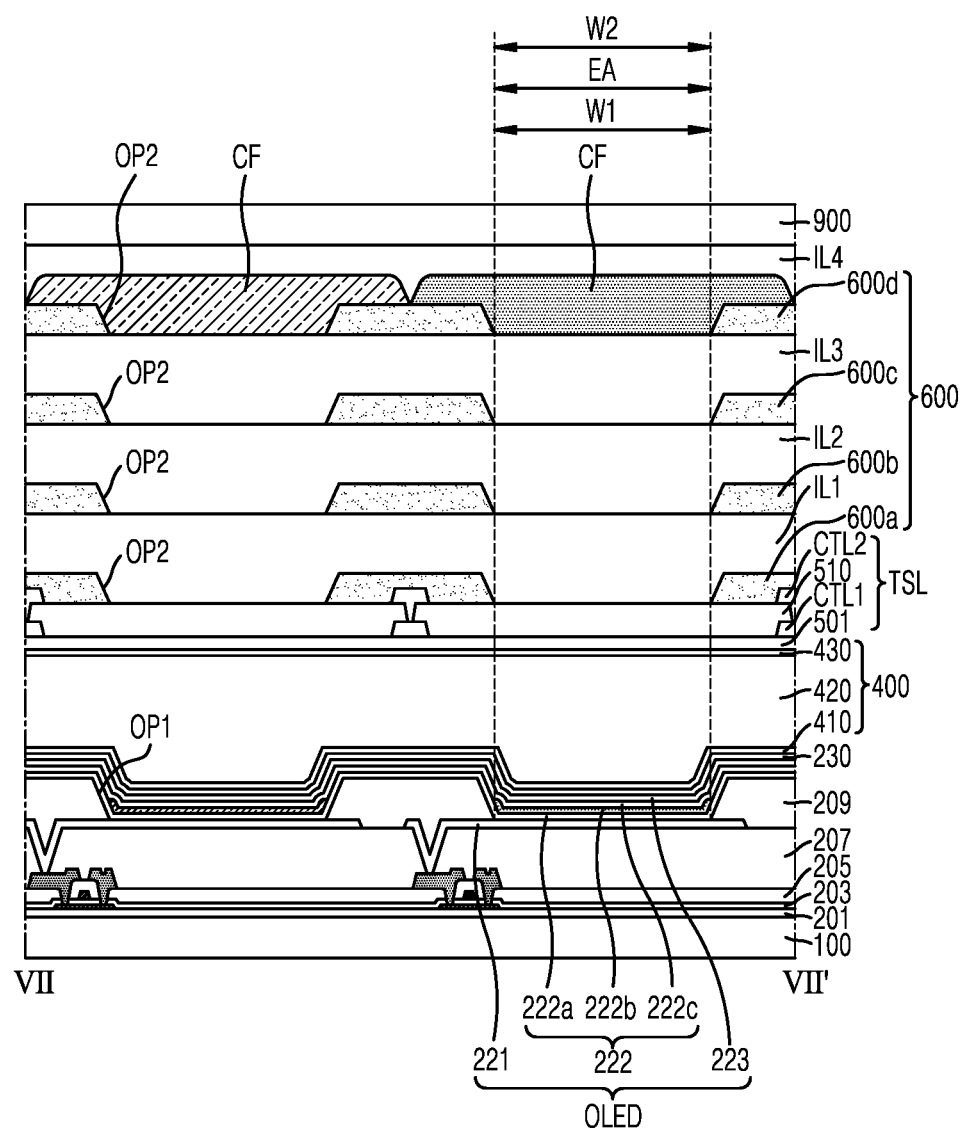
FIG. 22 is a schematic cross-sectional view of the display area taken along line VII-VII' of FIG. 21.

FIG. 14 is a schematic plan view of a display apparatus according to an embodiment. FIG. 15 is a schematic plan view of a portion of a display area of FIG. 14. FIG. 16 is a schematic cross-sectional view of the display area taken along line IV-IV' of FIG. 15. FIG. 17 is a schematic plan view of a portion of a display area of FIG. 14. FIG. 18 is a schematic cross-sectional view of the display area taken along line V-V of FIG. 17. FIG. 19 is a schematic plan view of a portion of a display area of FIG. 14. FIG. 20 is a schematic cross-sectional view of the display area taken along line VI-VI' of FIG. 19. FIG. 21 is a schematic plan view of a portion of a display area of FIG. 14. FIG. 22 is a schematic cross-sectional view of the display area taken along line VII-VII' of FIG. 21.

As illustrated in FIG. 14, a display panel 10' of the display apparatus may include the substrate 100 having a display area DA, in which pixel groups PG may be repeatedly arranged in a first direction and a second direction. Each pixel group PG may include a first pixel PX1, a second pixel PX2, and a third pixel PX3. Here, the first pixel PX1 and the second pixel PX2 may be alternately arranged in the second direction, and the third pixel PX3 may be repeatedly arranged in the second direction in a column adjacent to the column with the first pixel PX1 and the second pixel PX2. The length of the third pixel PX3 in the second direction may be equal to or greater than a sum of the lengths of the first and second pixels PX1 and PX2 in the second direction.

Hereinafter, the descriptions regarding the display layer and the touch sensing layer TSL which were explained in the embodiments illustrated in FIGS. 7 and 8 are not repeated.

As illustrated in FIG. 16, the display panel 10' may include the substrate 100, the display layer on the substrate 100, the touch sensing layer TSL, the light-blocking layer 600, and the optical layer 800. The display layer may include a pixel circuit including a thin-film transistor TFT, an organic light-emitting diode OLED, which is a display element, and the thin-film encapsulation layer 400. Insulating layers may be disposed between the substrate 100 and the thin-film encapsulation layer 400. The optical layer 800 may be disposed on the light-blocking layer 600, and the cover window 900 may be disposed on the optical layer 800. A fourth insulating layer IL4 may be disposed between the light-blocking layer 600 and the optical layer 800.

The light-blocking layer 600 may surround the organic light-emitting diode OLED, which is the display element, of each of the first through third pixels PX1 through PX3, and may not overlap the emission area EA of each of the first through third pixels PX1 through PX3. The light-blocking layer 600 may include multiple layers, for example, two or more layers, and the layers of the light-blocking layer 600 may be, in a cross-sectional view, spaced apart from each other in a third direction by an insulating layer. In FIG. 16, the light-blocking layer 600 may include four layers, the first through fourth light-blocking layers 600a, 600b, 600c, and 600d. A first insulating layer IL1 may be disposed on the first light-blocking layer 600a, a second light-blocking layer 600b may be disposed on the first insulating layer IL1, a second insulating layer IL2 may be disposed on the second light-blocking layer 600b, a third light-blocking layer 600c may be disposed on the second insulating layer IL2, a third insulating layer IL3 may be disposed on the third light-blocking layer 600c, a fourth light-blocking layer 600d may be disposed on the third insulating layer IL3, and a fourth insulating layer IL4 may be disposed on the fourth light-blocking layer 600d.

Each of the first through fourth insulating layers IL1, IL2, IL3, and IL4 may include inorganic or organic material that may transmit light, and may include a single layer or multiple layers.

An opening OP2 of each of the first through fourth light-blocking layers 600a, 600b, 600c, and 600d may be located to correspond to the emission area EA of each of the first through third pixels PX1 through PX3. The opening OP2 of each of the first through fourth light-blocking layers 600a, 600b, 600c, and 600d may overlap an opening OP1 of the pixel-defining layer 209. An edge of the opening OP2 of each of the first through fourth light-blocking layers 600a, 600b, 600c, and 600d may correspond to (coincide with) an edge of the opening OP1 of the pixel-defining layer 209 and may have substantially the same shape as the edge of the opening OP1 of the pixel-defining layer 209. A width W2 of the opening OP2 of each of the first through fourth light-blocking layers 600a, 600b, 600c, and 600d in the first direction may be the same as a width W1 of the emission area EA or the opening OP1 of the pixel-defining layer 209.

The optical layer 800 may be disposed on the fourth insulating layer IL4. The optical layer 800 may include a polarizing layer including a polarization plate or a polarization film.

According to the embodiment illustrated in FIGS. 15 and 16, when the emission area EA corresponds to the opening OP2 of the light-blocking layer 600, a user's view of the display apparatus from all oblique angles may be blocked.

In other examples, a viewing from the side at a selected direction (or angle) may be visible, and viewing from any other direction except from the selected angle may be blocked. For example, as illustrated in FIGS. 17 and 18, viewing angles from the sides other than from the right side may be blocked. An opening OP2 of each of the first through fourth light-blocking layers 600a through 600d may overlap an opening OP1 of the pixel-defining layer 209. The size of the opening OP2 may be greater than the size of the opening OP1. In a plan view, the upper, lower, and left edges of the opening OP2 may correspond to the upper, lower, and left edges of the opening OP1, respectively, and a right edge of the opening OP2 may be spaced apart from a right edge of the opening OP1. As the right edge of the opening OP2 may be spaced apart from the emission area EA, the right edge of the opening OP2 and the right edge of the opening OP1 may be spaced apart from each other by a space distance GD. Accordingly, in a first direction, a width W2 of the opening OP2 of each of the first through fourth light-blocking layers 600a through 600d may be greater than a width W1 of the emission area EA or the opening OP1 of the pixel-defining layer 209.

An embodiment illustrated in FIGS. 19 and 20 may have the same configurations as the embodiment of FIG. 18, except that in the embodiment of FIGS. 19 and 20, the refractive layer 700 may further be included.

The light-blocking layer 600 may include four layers, the first through fourth light-blocking layers 600a, 600b, 600c, and 600d. A first insulating layer IL1 may be disposed on the first light-blocking layer 600a, a second light-blocking layer 600b may be disposed on the first insulating layer IL1, a second insulating layer IL2 may be disposed on the second light-blocking layer 600b, a third light-blocking layer 600c may be disposed on the second insulating layer IL2, a third insulating layer IL3 may be disposed on the third light-blocking layer 600c, a fourth light-blocking layer 600d may be disposed on the third insulating layer IL3, and the refractive layer 700 may be disposed on the fourth light-blocking layer 600d. Each of the first through third insulating layers IL1, IL2, and IL3 may include a light transmissive inorganic or organic material and may include a single layer or multiple layers.

The refractive layer 700 may include the first refractive layer 710 and the second refractive layer 730. An opening OP3 of the first refractive layer 710 may overlap an opening OP1 of the pixel-defining layer 209 or an opening OP2 of each of the first through fourth light-blocking layers 600a, 600b, 600c, and 600d. An edge of the opening OP3 of the first refractive layer 710 may correspond to (coincide with) an edge of the opening OP1 of the pixel-defining layer 209 and may have substantially the same shapes as the edge of the opening OP1 of the pixel-defining layer 209.

An embodiment illustrated in FIGS. 21 and 22 may have the same configurations as the embodiment illustrated in FIG. 18, except that in the embodiment of FIGS. 21 and 22, the optical layer 800 may be omitted, and a color filter layer CF may be added.

The light-blocking layer 600 may include four layers, the first through fourth light-blocking layers 600a, 600b, 600c, and 600d. A first insulating layer IL1 may be disposed on the first light-blocking layer 600a, a second light-blocking layer 600b may be disposed on the first insulating layer IL1, a second insulating layer IL2 may be disposed on the second light-blocking layer 600b, a third light-blocking layer 600c may be disposed on the second insulating layer IL2, a third insulating layer IL3 may be disposed on the third light-blocking layer 600c, a fourth light-blocking layer 600d may be disposed on the third insulating layer IL3, and the color filter layer CF may be disposed on the fourth light-blocking layer 600d. A fourth insulating layer IL4 may be disposed on the color filter layer CF. Each of the first through fourth insulating layers IL1, IL2, IL3, and IL4 may include an inorganic or organic material that transmits light and may include a single layer or multiple layers. The color filter layer CF may be disposed to overlap the emission area EA. The color filter layer CF may cover a portion of the fourth light-blocking layer 600d.

According to the embodiments described above, a display apparatus may have an on-cell structure, in which the touch sensing layer TSL is directly disposed on a display layer without an additional substrate. However, in other examples, a display apparatus may have an in-cell structure, in which the touch sensing layer TSL is formed in a display layer. In other examples, the touch sensing layer TSL may be omitted, and the light-blocking layer 600 may be directly provided on the thin-film encapsulation layer 400.

A display apparatus according to embodiments may include a refractive layer including a low refractive layer and a high refractive layer and/or a light-blocking layer, thereby improving the efficiency of light extraction toward a front surface of the display apparatus, and minimizing or blocking the side viewing angles. Accordingly, it is possible to prevent the exposure of information displayed on the display apparatus to surrounding people other than a user.

According to a display apparatus according to embodiments, in order to block a side viewing angle at only a selected direction, a portion of an edge of an opening of a pixel-defining layer and a portion of an edge of an opening of a blocking layer may be disposed to be spaced apart from each other. For example, the above-mentioned embodiments may be applied to a display apparatus included in a vehicle, in order that a side view may be visible from the driver's direction, but the side view may be blocked from other directions, such as the direction of a passenger seat, etc.

As described above, according to the one or more of the above embodiments of the disclosure, a display apparatus capable of minimizing the risk of exposure of personal information in public facilities and multiple-usage establishments may be provided. However, these effects are examples, and effects of the embodiments are as described above.

It should be understood that embodiments described herein should be considered in a descriptive sense only and not for purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a display element on a substrate;
an encapsulation layer on the display element;
a light-blocking layer on the encapsulation layer and including a first opening at a location corresponding to an emission area of the display element;
a first refractive layer on the light-blocking layer and including a second opening overlapping the first opening of the light-blocking layer; and
a second refractive layer on the first refractive layer to fill the second opening, the second refractive layer having a refractive index that is higher than a refractive index of the first refractive layer.

2. The display apparatus of claim 1, wherein an edge of the first opening of the light-blocking layer corresponds to an edge of the second opening of the first refractive layer.

3. The display apparatus of claim 1, wherein an edge of the first opening of the light-blocking layer and an edge of the second opening of the first refractive layer are spaced apart from each other.

4. The display apparatus of claim 1, further comprising:
a pixel-defining layer including a third opening corresponding to the emission area of the display element and covering an edge of a pixel electrode of the display element,
wherein an edge of the first opening of the light-blocking layer corresponds to an edge of the third opening of the pixel-defining layer.

5. The display apparatus of claim 4, wherein
an edge of the second opening of the first refractive layer corresponds to the edge of the third opening of the pixel-defining layer.

6. The display apparatus of claim 1, further comprising:
a pixel-defining layer including a third opening corresponding to the emission area of the display element and covering an edge of a pixel electrode of the display element,
wherein a portion of an edge of the first opening of the light-blocking layer is spaced apart from a portion of an edge of the third opening of the pixel-defining layer, and
a remaining portion of the edge of the first opening of the light-blocking layer corresponds to a remaining portion of the edge of the third opening of the pixel-defining layer.

7. The display apparatus of claim 1, wherein
the light-blocking layer includes a first light-blocking layer and a second light-blocking layer spaced apart from the first light-blocking layer, and
an insulating layer between the first light-blocking layer and the second light-blocking layer.

8. The display apparatus of claim 1, further comprising:
a polarizing layer on the second refractive layer.

9. A display apparatus comprising:
a substrate including a display area, the display area including a first area and a second area;
a first display element on the first area of the substrate;
a second display element on the second area of the substrate;
an encapsulation layer on the first display element and the second display element;

a light-blocking layer on the encapsulation layer and including a first opening at a location corresponding to an emission area of the second display element;

a first refractive layer on the light-blocking layer and including a second opening overlapping the first opening of the light-blocking layer; and a second refractive layer on the first refractive layer to fill the second opening, the second refractive layer having a refractive index that is higher than a refractive index of the first refractive layer.

10. The display apparatus of claim 9, wherein the first display element and the second display element are configured to emit light of a same color, and a size of a pixel electrode of the second display element is greater than a size of a pixel electrode of the first display element.

11. The display apparatus of claim 10, further comprising:

a pixel-defining layer including a third opening and a plurality of fourth openings, wherein the third opening corresponds to an emission area of the first display element, the plurality of fourth openings correspond to a plurality of sub-emission areas that divide the emission area of the second display element, and the first opening of the light-blocking layer overlaps at least one of the plurality of fourth openings of the pixel-defining layer.

12. The display apparatus of claim 11, wherein an edge of the first opening of the light-blocking layer corresponds to an edge of at least one of the plurality of fourth openings of the pixel-defining layer.

13. The display apparatus of claim 11, wherein a portion of an edge of the first opening of the light-blocking layer is spaced apart from a portion of an edge of at least one of the plurality of fourth openings of the pixel-defining layer, and a remaining portion of the edge of the first opening of the light-blocking layer corresponds to a remaining portion of the edge of at least one of the plurality of fourth openings of the pixel-defining layer.

14. The display apparatus of claim 9, wherein the light-blocking layer includes a first light-blocking layer and a second light-blocking layer spaced apart from the first light-blocking layer, and an insulating layer is between the first light-blocking layer and the second light-blocking layer.

15. The display apparatus of claim 9, further comprising:

a controller configured to control the first display element and the second display element to emit light in a first driving mode, and controls the first display element not to emit light and the second display element to emit light in a second driving mode.

* * * * *